(12) United States Patent
Shih

(10) Patent No.: US 11,587,901 B2
(45) Date of Patent: Feb. 21, 2023

(54) SEMICONDUCTOR DEVICE WITH REDISTRIBUTION STRUCTURE AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 18 days.

(21) Appl. No.: 17/214,350

(22) Filed: Mar. 26, 2021

(65) Prior Publication Data

US 2022/0310545 A1    Sep. 29, 2022

(51) Int. Cl.
*H01L 25/065* (2006.01)
*H01L 23/00* (2006.01)

(52) U.S. Cl.
CPC ............. *H01L 24/24* (2013.01); *H01L 24/09* (2013.01); *H01L 24/19* (2013.01); *H01L 24/32* (2013.01); *H01L 24/82* (2013.01); *H01L 25/0657* (2013.01); *H01L 2224/0903* (2013.01); *H01L 2224/09102* (2013.01); *H01L 2224/24145* (2013.01); *H01L 2224/32104* (2013.01); *H01L 2224/32147* (2013.01); *H01L 2224/82203* (2013.01); *H01L 2225/06541* (2013.01)

(58) Field of Classification Search
CPC ......... H01L 24/24; H01L 24/09; H01L 24/19; H01L 24/32; H01L 24/82; H01L 25/0657
USPC ........ 257/774; 438/629, 637, 639, 640, 667, 438/668, 672, 675, 700, 701, 713, 978
See application file for complete search history.

(56) References Cited

U.S. PATENT DOCUMENTS

2018/0286782 A1* 10/2018 Noda ................. H01L 21/76802
2020/0411636 A1* 12/2020 Kao .................... H01L 23/5223

* cited by examiner

*Primary Examiner* — Didarul A Mazumder
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first semiconductor structure including a first substrate, and a first circuit layer positioned on the first substrate, a first redistribution structure positioned on the first circuit layer, and a second semiconductor structure including a second circuit layer positioned on the first redistribution structure, and a second substrate positioned on the second circuit layer. A layout of the first circuit layer and a layout of the second circuit layer are substantially the same and the first redistribution structure is electrically coupled to the first semiconductor structure and the second semiconductor structure.

8 Claims, 23 Drawing Sheets

SEMICONDUCTOR DEVICE WITH REDISTRIBUTION STRUCTURE AND METHOD FOR FABRICATING THE SAME

TECHNICAL FIELD

The present disclosure relates to a semiconductor device and a method for fabricating the semiconductor device, and more particularly, to a semiconductor device with a redistribution structure and a method for fabricating the semiconductor device with the redistribution structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first semiconductor structure including a first substrate, and a first circuit layer positioned on the first substrate, a first redistribution structure positioned on the first circuit layer, and a second semiconductor structure including a second circuit layer positioned on the first redistribution structure, and a second substrate positioned on the second circuit layer. A layout of the first circuit layer and a layout of the second circuit layer are substantially the same and the first redistribution structure is electrically coupled to the first semiconductor structure and the second semiconductor structure.

In some embodiments, the semiconductor device includes a third semiconductor structure including a third circuit layer positioned on the second substrate, and a fourth semiconductor structure including a fourth circuit layer positioned on the third semiconductor structure. The layout of the second circuit layer, a layout of the third circuit layer, and a layout of the fourth circuit layer are substantially the same.

In some embodiments, the semiconductor device includes a first through semiconductor via positioned along the first substrate, extending to the first circuit layer, and topologically aligned with and electrically coupled to a corresponding first conductive line in the first circuit layer.

In some embodiments, the first redistribution structure includes a first redistribution via topologically aligned with and electrically coupled to a corresponding first conductive pad in the first circuit layer, a first redistribution line physically and electrically coupled to the first redistribution via, and a first redistribution pad physically and electrically coupled to the first redistribution line and topologically aligned with and electrically coupled to a corresponding second conductive pad in the second circuit layer.

In some embodiments, the second semiconductor structure includes a second bonding layer positioned between the second circuit layer and the first redistribution structure, and a second bonding pad positioned along the second bonding layer, and topologically aligned with and electrically coupled to the corresponding second conductive pad in the second circuit layer and the first redistribution pad.

In some embodiments, the semiconductor device includes a first interconnect layer positioned between the second semiconductor structure and the third semiconductor structure, and a first conductor positioned along the first interconnect layer, and electrically coupled to a corresponding third conductive pad in the third circuit layer and a corresponding second conductive line in the second circuit layer.

In some embodiments, the third semiconductor structure includes a third bonding layer positioned between the first interconnect layer and the third circuit layer, and a third bonding pad positioned along the third bonding layer, and topologically aligned with and electrically coupled to the corresponding third conductive pad in the third circuit layer and the first conductor.

In some embodiments, the semiconductor device includes a second through semiconductor via physically and electrically coupled to the first conductor and the corresponding second conductive line in the second circuit layer.

In some embodiments, the first through semiconductor via includes a filler layer positioned along the first substrate and extending to the first circuit layer, and two isolation layers positioned on two sides of the filler layer. The two isolation layers comprise silicon oxide, silicon nitride, silicon oxynitride, tetra-ethyl ortho-silicate, parylene, epoxy, or poly(p-xylene).

In some embodiments, the first through semiconductor via includes a seed layer positioned between the two isolation layers and the filler layer and between the filler layer and the corresponding first conductive line in the first circuit layer.

In some embodiments, the first through semiconductor via includes an adhesive layer positioned between the seed layer and the two isolation layer and between the seed layer and the corresponding first conductive line in the first circuit layer. The adhesive layer comprises titanium, tantalum, titanium tungsten, or manganese nitride.

In some embodiments, the first through semiconductor via includes a barrier layer positioned between the adhesive layer and the two isolation layers and between the adhesive layer and the corresponding first conductive line in the first circuit layer. The barrier layer comprises tantalum, tantalum nitride, titanium, titanium nitride, rhenium, nickel boride, or tantalum nitride/tantalum bilayer.

In some embodiments, the semiconductor device includes a connector physically and electrically coupled to the first through semiconductor via. The connector is a solder, a bump, or the like.

In some embodiments, the semiconductor device includes a thermal dissipation layer positioned on the fourth semiconductor structure. The thermal dissipation layer includes vertically oriented graphite and carbon nanotubes.

Another aspect of the present disclosure provides a semiconductor device including a fourth semiconductor structure including a fourth substrate, and a fourth circuit layer positioned on the fourth substrate, a third semiconductor structure including a third circuit layer positioned on the fourth circuit layer, a second semiconductor structure including a second circuit layer positioned on the third semiconductor structure, a first semiconductor structure including a first circuit layer positioned on the second semiconductor structure, a first redistribution structure including a first redistribution pad topologically aligned with and electrically coupled to a corresponding second conductive pad in the second circuit layer, a first redistribution line physically and electrically coupled to the first redistribution pad, and a first redistribution via physically and electrically coupled to the first redistribution line, and topologically aligned with and electrically coupled to a corresponding first conductive pad in the first circuit layer, and a fourth through semiconductor via positioned along the fourth substrate, extending to the fourth circuit layer, and topologically aligned with and electrically coupled to a corresponding fourth conductive line in the fourth circuit layer. A layout of the fourth circuit layer, a layout of the third circuit layer, a layout of the second circuit layer, and a layout of the first circuit layer are substantially the same.

Another aspect of the present disclosure provides a method for fabricating a semiconductor device including providing a first semiconductor structure including a first substrate, and a first circuit layer on the first substrate, forming a first redistribution structure on the first semiconductor structure and electrically coupled to the first semiconductor structure, bonding a second circuit layer on the first redistribution structure through a wafer-to-wafer hybrid bonding process, and forming a first through semiconductor via along the first substrate, extending to the first circuit layer, and electrically coupled to a corresponding first conductive line in the first circuit layer. The first redistribution structure is electrically coupled to a corresponding second conductive pad in the second circuit layer. A layout of the first circuit layer and a layout of the second circuit layer are substantially the same.

In some embodiments, the method for fabricating the semiconductor device includes forming a third circuit layer on the second circuit layer and forming a fourth circuit layer on the third circuit layer. The layout of the second circuit layer, a layout of the third circuit layer, and a layout of the fourth circuit layer are substantially the same.

In some embodiments, the method for fabricating the semiconductor device includes forming a connector physically and electrically coupled to the first through semiconductor via.

Another aspect of the present disclosure provides a method for fabricating a semiconductor device including providing a first substrate, forming a plurality of first device elements on the first substrate, forming a first through semiconductor via extending to the first substrate, forming a first circuit layer to cover the plurality of first device elements, forming a first redistribution structure on the first circuit layer and electrically coupled to a corresponding first conductive pad in the first circuit layer, and bonding a second circuit layer on the first redistribution structure through a wafer-to-wafer hybrid bonding process. The first through semiconductor via is electrically coupled to a corresponding first conductive line in the first circuit layer. The first redistribution structure is electrically coupled to a corresponding second conductive pad in the second circuit layer. A layout of the first circuit layer and a layout of the second circuit layer are substantially the same.

In some embodiments, the method for fabricating the semiconductor device includes thinning the first substrate to at least partially expose the first through semiconductor via and forming a connector physically and electrically coupled to the first through semiconductor via.

Due to the design of the semiconductor device of the present disclosure, the first redistribution structure may be electrically coupled to the first semiconductor structure and the second semiconductor structure having the same layout. Therefore, the cost and process complexity for fabricating the semiconductor device may be reduced.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
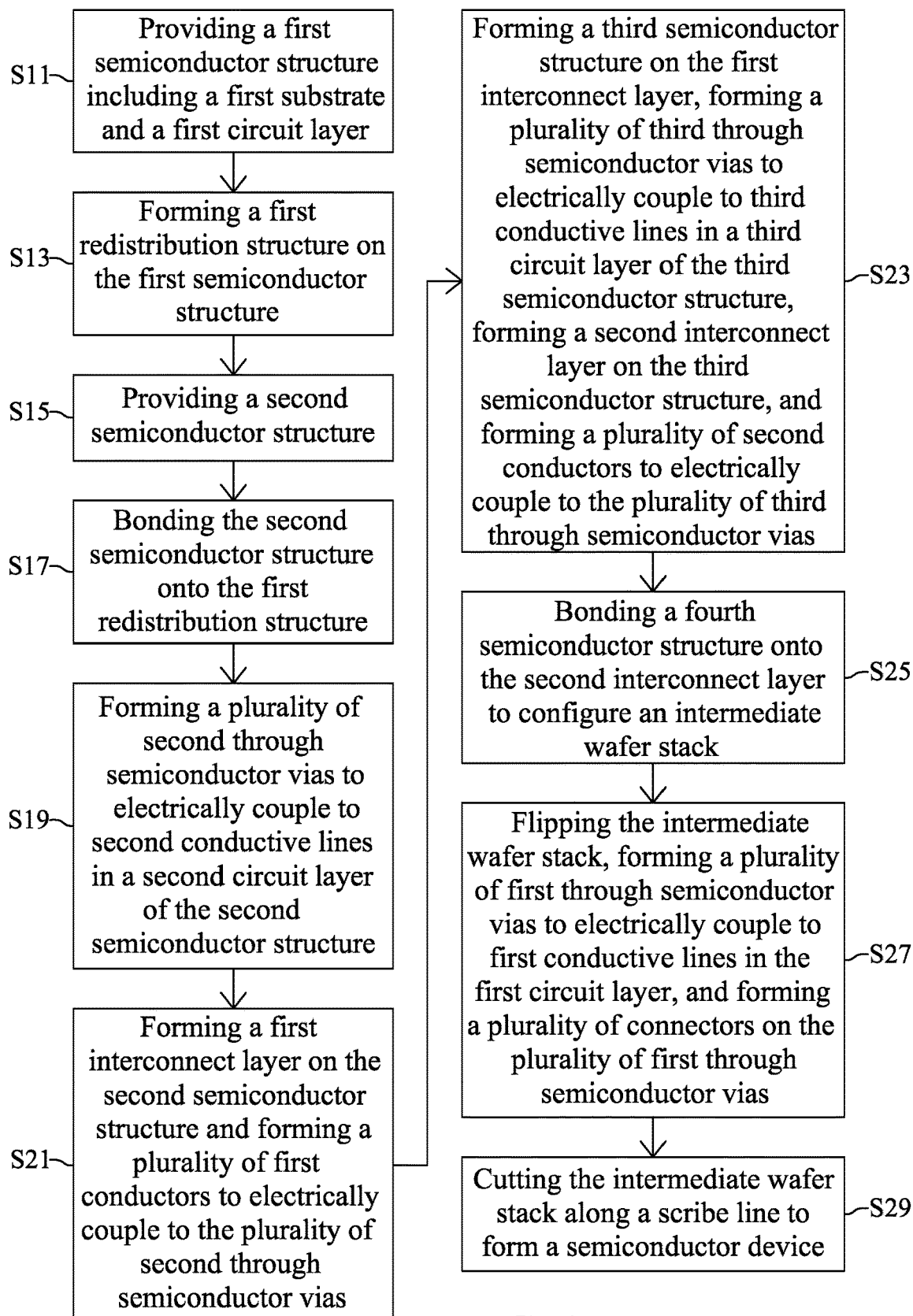
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

FIG. 1 illustrates, in a flowchart diagram form, a method 10 for fabricating a semiconductor device 1A in accordance with one embodiment of the present disclosure. FIGS. 2 to 12 illustrate, in schematic cross-sectional view diagrams, part of a flow for fabricating the semiconductor device 1A in accordance with one embodiment of the present disclosure. FIG. 13 illustrates, in a schematic close-up cross-sectional view diagram, an intermediate semiconductor device in accordance with one embodiment of the present disclosure. FIG. 14 illustrate, in a schematic cross-sectional view diagram, part of the flow for fabricating the semiconductor device 1A in accordance with one embodiment of the present disclosure.

Figure 2:
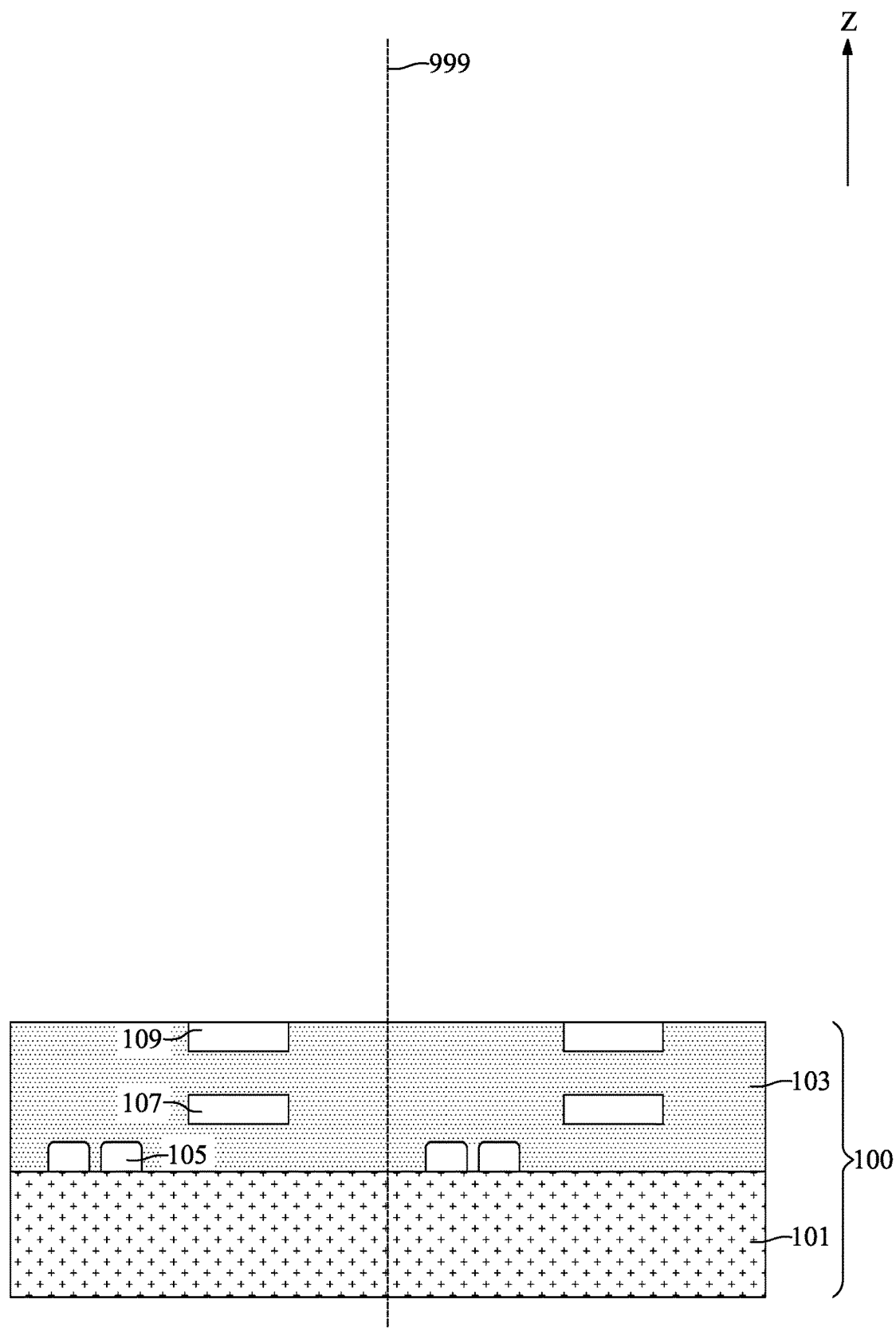
FIGS. 2 to 12 illustrate, in schematic cross-sectional view diagrams, part of a flow for fabricating the semiconductor device in accordance with one embodiment of the present disclosure.

With reference to FIGS. 1 and 2, at step S11, a first semiconductor structure 100 including a first substrate 101 and a first circuit layer 103 may be provided.

With reference to FIG. 2, the first substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials.

With reference to FIG. 2, the first circuit layer 103 may be formed on the first substrate 101. The first circuit layer 103 may include inter-layer dielectric layers and/or inter-metal dielectric layers containing a plurality of first device elements 105 and a plurality of first conductive features. The plurality of first device elements 105 may be transistors such as complementary metal-oxide-semiconductor transistors, metal-oxide-semiconductor field-effect transistors, fin field-effect-transistors, the like, or a combination thereof. The plurality of first conductive features may include first conductive lines 107, first conductive pads 109, and first conductive vias (not shown in FIG. 2), or other suitable conductive elements.

It should be noted that, in the description of the present disclosure, the topmost first conductive lines may be designated as the first conductive pads 109. The top surfaces of first conductive pads 109 may be substantially coplanar with the top surface of the first circuit layer 103.

The plurality of first conductive features may electrically connect the plurality of first device elements 105, respectively and correspondingly, to form functional units in the first circuit layer 103. A functional unit, in the description of the present disclosure, generally refers to functionally related logic circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex. In the present embodiment, the first semiconductor structure 100 including the plurality of first device elements 105 may be served as a memory.

The inter-layer dielectric layers and/or the inter-metal dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The inter-layer dielectric layers and/or the inter-metal dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps. The plurality of first device elements 105 and the plurality of first conductive features may be formed during the formation of the inter-layer dielectric layers and/or the inter-metal dielectric layers.

The plurality of first conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

It should be noted that, in the current stage, the first semiconductor structure 100 may be an intact wafer which can be divided into multiple dies by cutting along the scribe lines 999.

Figure 3:
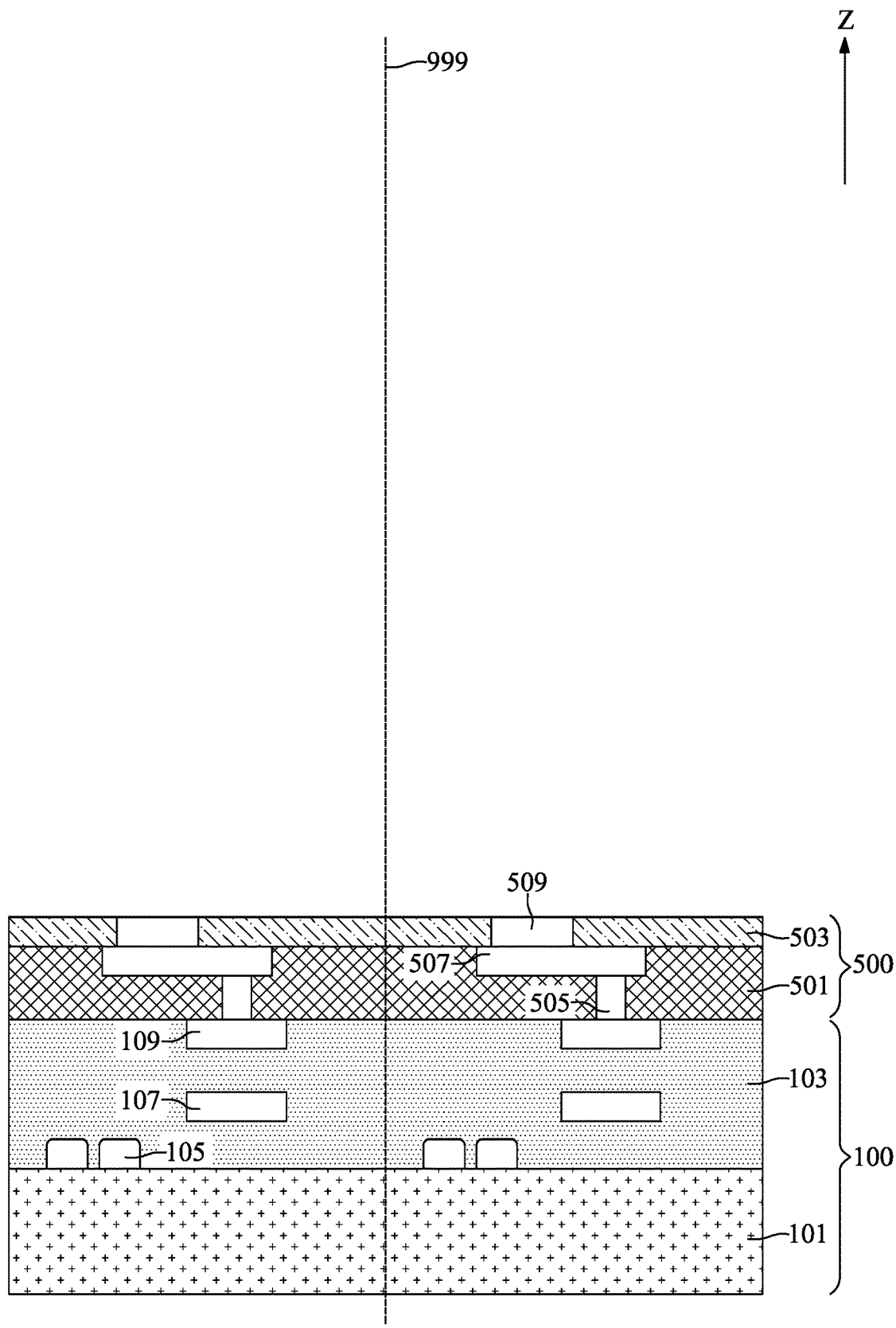

With reference to FIGS. 1 and 3, at step S13, a first redistribution structure 500 may be formed on the first semiconductor structure 100.

With reference to FIG. 3, the first redistribution structure 500 may be formed on a front surface of the first semiconductor structure 100. It should be noted that, in the description of the present disclosure, the term "face" or "front" surface is a term of art implying the major surface of the structure upon which is formed device elements and conductive features. Likewise, the "back" surface of a structure is that major surface opposite to the face.

Generally, the formation of first redistribution structure 500 may include forming one or more dielectric layers using any suitable method (e.g., a spin-on coating technique, sputtering, and the like) and forming conductive features in the dielectric layers. The formation of the conductive features may include patterning the dielectric layers (e.g., using photolithography and/or etching processes) and forming conductive features in the patterned dielectric layers (e.g., by depositing a seed layer, using a mask layer to define the shape of the conductive features, and using an electroless/electrochemical plating process).

With reference to FIG. 3, the first redistribution structure 500 may include a bottom dielectric layer 501, an upper dielectric layer 503, a plurality of first redistribution vias 505, a plurality of first redistribution lines 507, and a plurality of first redistribution pads 509. The bottom dielectric layer 501 may be formed on the front surface of the first semiconductor structure 100. That is, the bottom dielectric layer 501 may be formed on the first circuit layer 103. The upper dielectric layer 503 may be formed on the bottom dielectric layer 501. In some embodiments, the bottom dielectric layer 501 and the upper dielectric layer 503 may be formed of, for example, silicon oxide, silicon nitride, silicon oxynitride, silicon nitride oxide, silicon carbon nitride, the like, or a combination thereof. In some embodiments, the bottom dielectric layer 501 and the upper dielectric layer 503 may be formed of, for example, a polymer layer including polyimide, polybenzoxazole, benzocyclobuten, epoxy, silicone, acrylates, nano-filled phenoresin, siloxane, a fluorinated polymer, polynorbornene, or the like. The bottom dielectric layer 501 and the upper dielectric layer 503 may be formed of a same material but are not limited thereto. In some embodiments, the bottom dielectric layer 501 and the upper dielectric layer 503 may be referred to as a single layer. Top portions of the single layer may be used as a bonding layer in subsequent process steps.

For convenience of description, only one first redistribution via 505, one first redistribution line 507, and one first redistribution pad 509 are described.

With reference to FIG. 3, the first redistribution via 505 may be formed in the bottom dielectric layer 501 and may be physically and electrically coupled to a corresponding first conductive pad 109 in the first circuit layer 103. The first redistribution via 505 and the corresponding first conductive pad 109 may be topologically aligned. In the description of the present disclosure, an x-y-z coordinate system is assumed where x and y refer to dimensions within the plane parallel to the major surface of the structure and z refers a dimension perpendicular to the plane, two features are topographically aligned when those features have substantially the same x, y coordinates. The first redistribution line 507 may be formed in the bottom dielectric layer 501 and may be physically and electrically coupled to the first redistribution via 505. The first redistribution pad 509 may be formed along the upper dielectric layer 503 and may be physically and electrically coupled to the first redistribution line 507. The first redistribution pad 509 is not topographically aligned with the first redistribution via 505.

The first redistribution via 505, the first redistribution line 507, and the first redistribution pad 509 may be formed of, for example, tungsten, cobalt, zirconium, tantalum, titanium, aluminum, ruthenium, copper, metal carbides, metal nitrides, transition metal aluminides, or a combination thereof.

Figure 4:
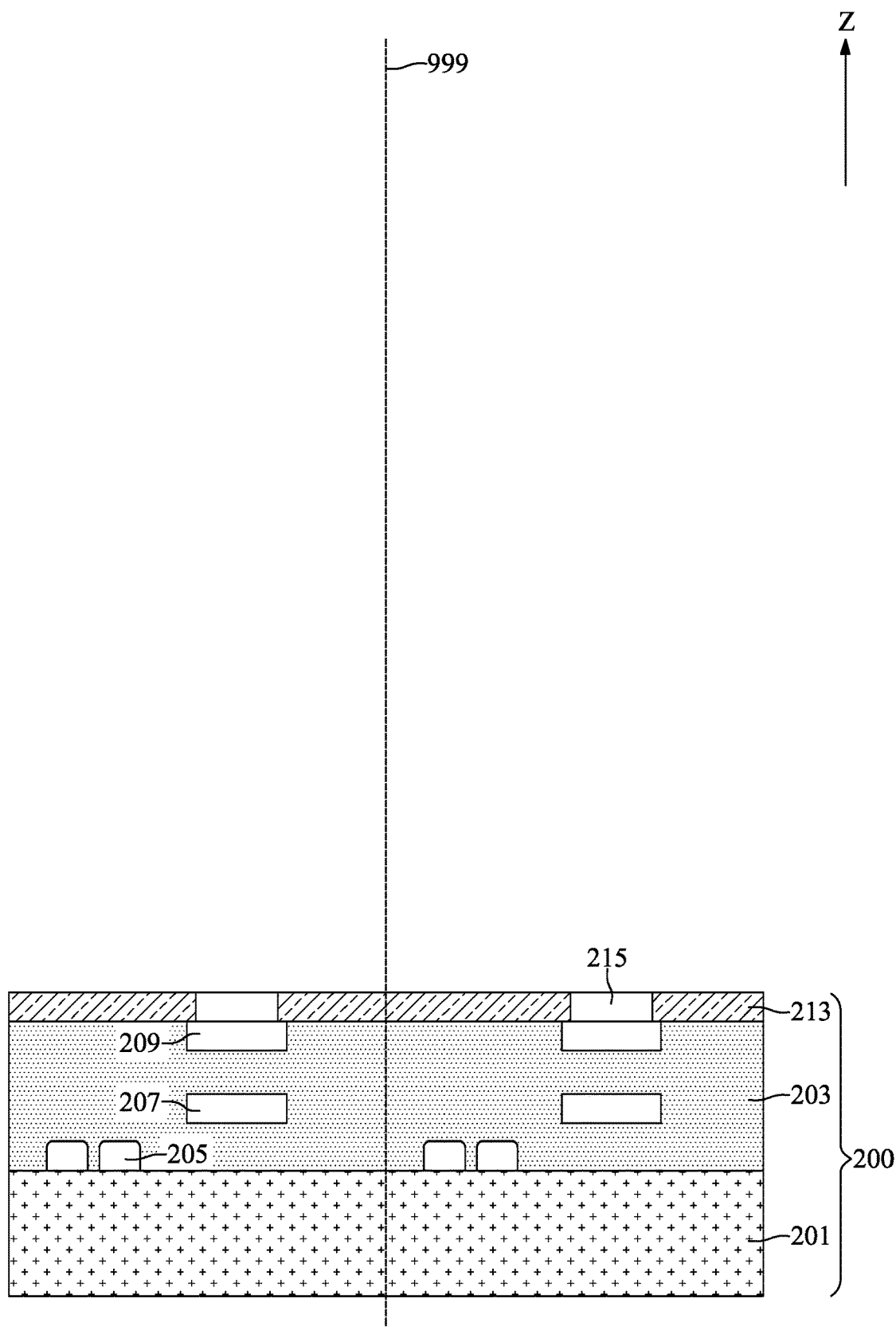

With reference to FIGS. 1 and 4, at step S15, a second semiconductor structure 200 may be provided.

With reference to FIG. 4, the second semiconductor structure 200 may include a second substrate 201, a second circuit layer 203, a second bonding layer 213, and a plurality of second bonding pads 215. The second substrate 201 may have a same structure as the first substrate 101 and may be formed of a same material as the first substrate 101. The second circuit layer 203 may have a same structure as the first circuit layer 103 and may include inter-layer dielectric layers and/or inter-metal dielectric layers containing a plurality of second device elements 205 and a plurality of second conductive features (e.g., second conductive lines 207, second conductive pads 209, and second conductive vias). Specifically, each of the plurality of second device elements 205 may be at the same topological position as the corresponding element of the plurality of first device elements 105. Each of the plurality of second conductive features may be at the same topological position as the corresponding feature of the plurality of first conductive features. That is, the second circuit layer 203 and the first circuit layer 103 may have a same layout and the first semiconductor structure 100 and the second semiconductor structure 200 may provide a same functionality.

With reference to FIG. 4, the second bonding layer 213 may be formed on the second circuit layer 203. In some embodiments, the second bonding layer 213 may be formed of, for example, a non-organic material selected from un-doped silicate glass, silicon nitride, silicon oxynitride, silicon oxide, silicon nitride oxide, silicon carbon nitride, and a combination thereof. In some embodiments, the second bonding layer 213 may be formed of, for example, a polymer layer such as an epoxy, polyimide, benzocyclobutene, polybenzoxazole, benzocyclobutene, silicone, acrylates, nano-filled phenoresin, siloxane, a fluorinated polymer, polynorbornene, or the like. The second bonding layer 213 may be formed by a deposition process such as chemical vapor deposition, plasma-enhanced chemical vapor deposition, evaporation, or spin-on coating. For convenience of description, only one second bonding pad 215 is described. The second bonding pad 215 may be formed along the second bonding layer 213 and may be physically and electrically coupled to a corresponding second conductive pad 209 in the second circuit layer 203. The second bonding pad 215 and the corresponding second conductive pad 209 in the second circuit layer 203 may be topologically aligned.

Figure 5:
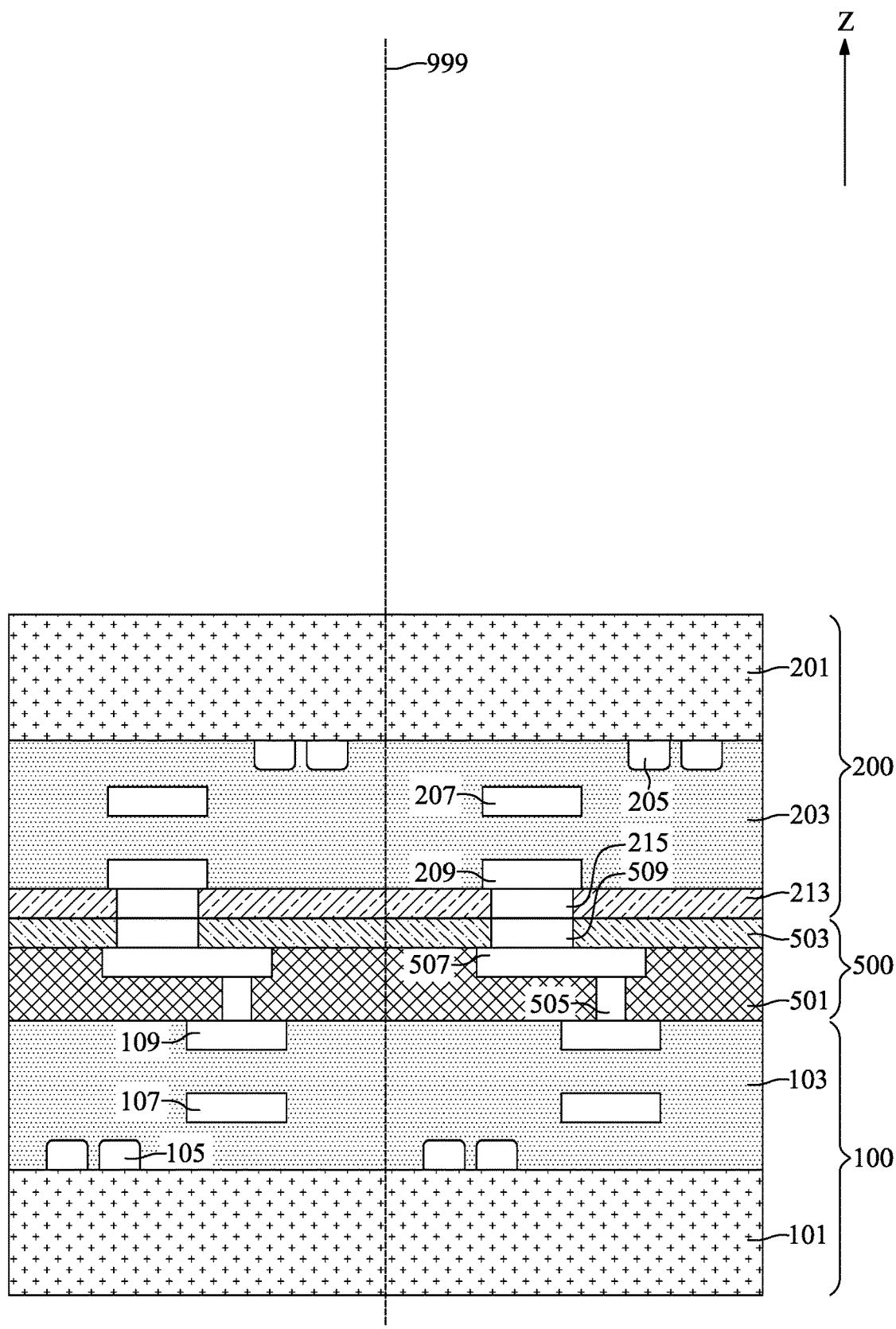

With reference to FIGS. 1 and 5, at step S17, the second semiconductor structure 200 may be bonded onto the first redistribution structure 500.

With reference to FIG. 5, the second semiconductor structure 200 may be flipped and may be bonded onto the first redistribution structure 500 in a face-to-face configuration through a wafer-to-wafer hybrid bonding process. Specifically, the second bonding layer 213 may be bonded onto the upper dielectric layer 503 to form a stack consisting of the first semiconductor structure 100, the first redistribution structure 500, and the second semiconductor structure 200. After the bonding process, the first redistribution pad 509 and the second bonding pad 215 may be topologically aligned.

In some embodiments, the bonding of the second semiconductor structure 200 onto the first redistribution structure 500 does not use any carriers.

In some embodiments, the wafer-to-wafer hybrid bonding process may include activating exposed surfaces of the second bonding layer 213 and the upper dielectric layer 503 (e.g., in a plasma process), cleaning the second bonding layer 213 and the upper dielectric layer 503 after activation, contacting the activated surface of the second bonding layer 213 and the activated surface of the upper dielectric layer 503, and performing a thermal annealing process to strengthen the bonding between the second bonding layer 213 and the upper dielectric layer 503.

In some embodiments, the wafer-to-wafer hybrid bonding process may include dielectric-to-dielectric bonding, metal-to-metal bonding, or metal-to-dielectric bonding or metal-to-adhesive bonding. The dielectric-to-dielectric bonding may originate from the bonding between the second bonding layer 213 and the upper dielectric layer 503. The metal-to-metal bonding may originate from the bonding between the second bonding pad 215 and the first redistribution pad 509. The metal-to-dielectric bonding or metal-to-adhesive bonding may originate from the bonding between the second bonding pad 215 and the upper dielectric layer 503 or between the first redistribution pad 509 and the second bonding layer 213.

In some embodiments, when the second bonding pad 215 and the upper dielectric layer 503 are formed of, for example, silicon oxide or silicon nitride, the bonding between the second bonding pad 215 and the upper dielectric layer 503 may be based on the hydrophilic bonding mechanism. Hydrophilic surface modifications may be applied to the second bonding pad 215 and the upper dielectric layer 503 before bonding. In some embodiments, when the second bonding pad 215 and the upper dielectric layer 503 are formed of polymer adhesives such as polyimide, benzocyclobutenes, and polybenzoxazole, the bonding between the second bonding pad 215 and the upper dielectric layer 503 may be based on thermo-compression bonding.

In some embodiments, the bonding methods for bonding the second semiconductor structure 200 onto the first redistribution structure 500 may include, for example, thermo-compression bonding, passivation-capping-layer assisted bonding, or surface activated bonding. The process pressure of the bonding methods may be between about 100 MPa and about 150 MPa. The process temperature of the bonding methods may be between about room temperature and about 400° C. In some embodiments, surface treatments such as wet chemical cleaning and gas/vapor-phase thermal treatments may be used to lower the process temperature of the bonding methods or to short the time consuming of the bonding method. In some embodiments, an annealing process may be performed after the bonding process to enhance dielectric-to-dielectric bonding and to induce thermal expansion of metal-to-metal bonding so as to further improve the bonding quality.

Conventionally, when bonding two wafers having the same layout in a face-to-face configuration, the respective conductive pads (e.g., the first conductive pads 109 and the second conductive pads 209) will be topologically mis-aligned due to flipping of one of the two wafers. To overcome such issue, the flipped wafer may be fabricated with a mirrored layout which is achieved by a different set of masks. Two sets of masks indicate the cost of fabricating such semiconductor device is huge and the process complexity of fabricating such semiconductor device is also overly complicated.

In contrast, in the present disclosure, the first redistribution structure 500 may re-route the respective conductive pads to electrically couple the two wafers having the same layout. Therefore, the semiconductor device 1A can be fabricated employing two wafers (e.g., the first semiconductor structure 100 and the second semiconductor structure 200) having the same layout in a face-to-face configuration. As a result, the cost and the process complexity of fabricating the semiconductor device 1A may be reduced.

Figure 6:
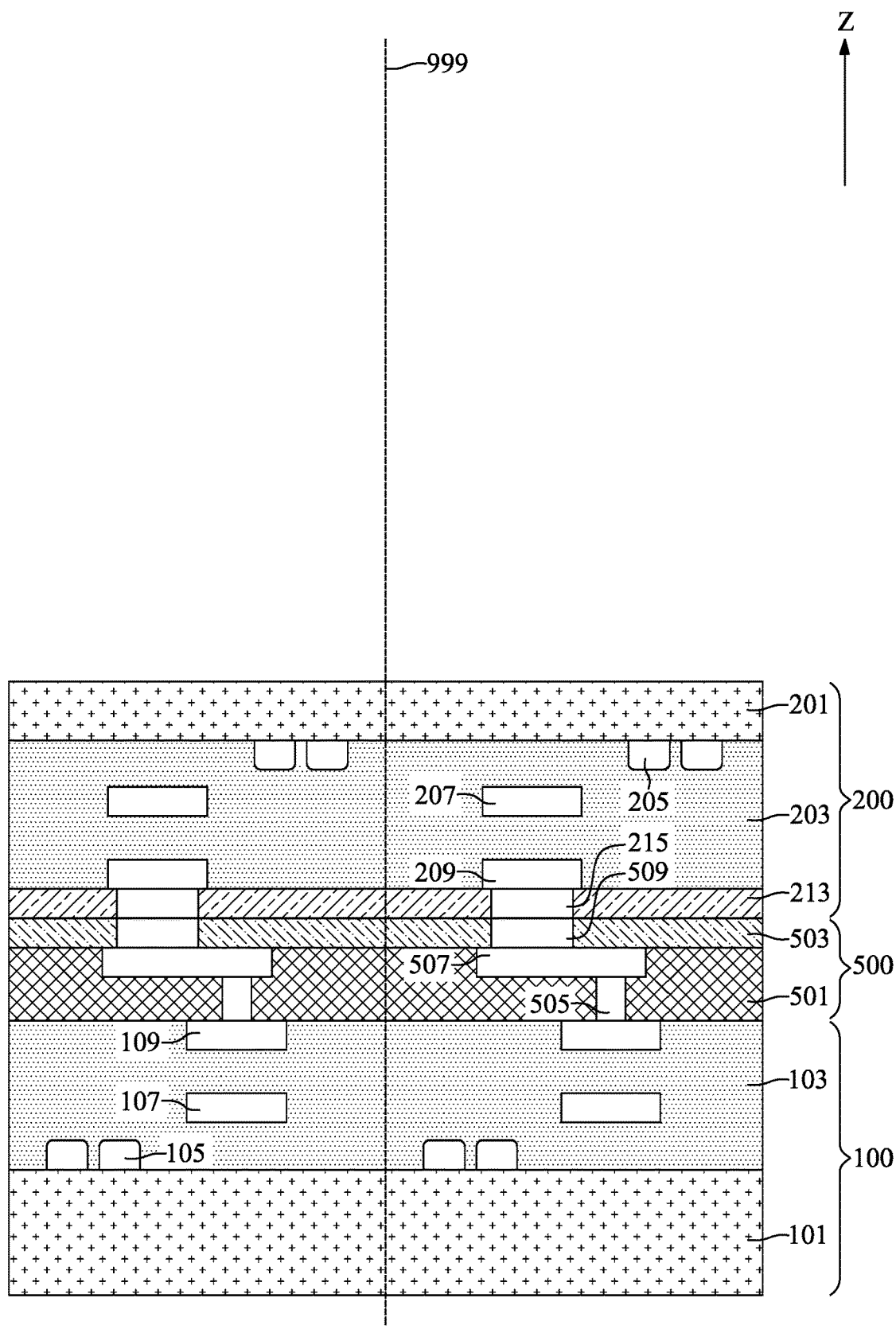
Figure 7:
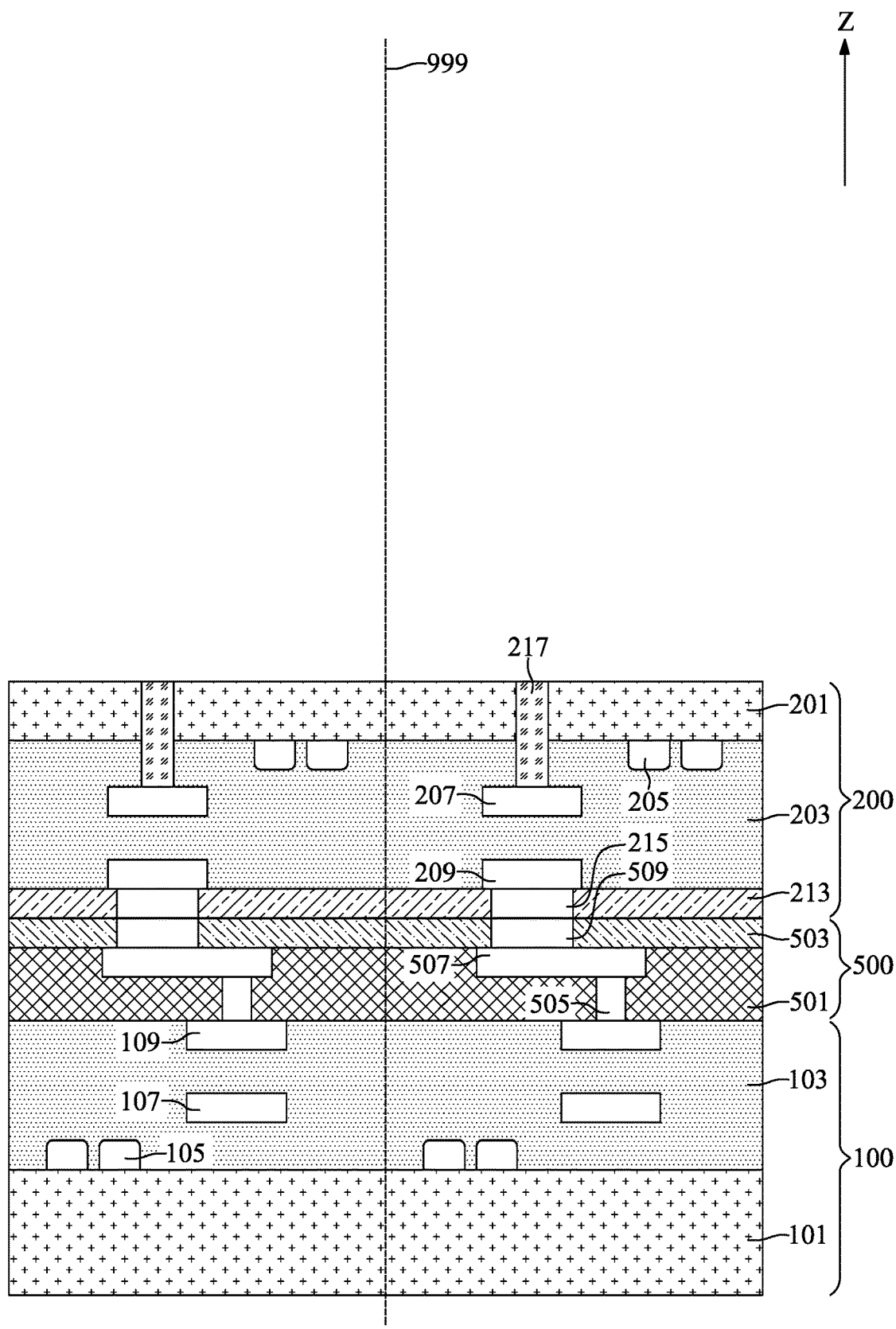

With reference to FIGS. 1, 6, and 7, at step S19, a plurality of second through semiconductor vias 217 may be formed to electrically couple to the second conductive lines 207 in the second circuit layer 203.

With reference to FIG. 6, a thinning process may be performed to reduce a thickness of the second substrate 201 so as to reduce the height of the semiconductor device 1A. This thinning process may allow for improved thermal dissipation and provide for a lower device profile, as well as reducing the depth and width required for the second through semiconductor vias 217 passing through the second substrate 201. Alternatively, in some embodiments, the thinning process for the second substrate 201 may be omitted.

In some embodiments, the second substrate 201 may be thinned to a thickness between about 0.5 μm and about 10 μm. The thinning process may be accomplished, e.g., using mechanical abrasion, polishing, or the like, or using chemical removal, such as a wet etch. A thinning-stop layer (not shown) may be implanted in substrate for thinning stop control. The thinning stop layer may be a dopant layer or an epitaxially grown layer having a thickness of about 0.2 μm to about 10 μm. The thickness of the thinning stop layer may be selected so that it is sufficiently thick to stop the thinning process depending on the employed etching selectivity. For example, if the used etching selectivity is about 1:100, the thinning stop layer may have a thickness between about 0.2 μm and about 5 μm. Other dimensions may be used for the thinning stop layer based on process configuration.

An advantageous, but not limiting, feature of the illustrated embodiment is that by bonding the first semiconductor structure 100 and the second semiconductor structure 200 prior to thinning, a carrier may not be required to provide wafer support during bonding. Furthermore, thin wafer handling techniques may not be required because both the first semiconductor structure 100 and the second semiconductor structure 200 are sufficiently thick. The lack of a carrier or thin wafer handling processes may lower manufacturing costs and increase yield.

For convenience of description, only one second through semiconductor via 217 is described.

With reference to FIG. 7, the second through semiconductor via 217 may be formed along the second substrate 201, extending to the second circuit layer 203, and physically and electrically coupled to a corresponding second conductive line 207 in the second circuit layer 203. Generally, the second through semiconductor via 217 may be formed by liner deposition and conductive material filling in a via opening. A planarization process, such as chemical mechanical polishing, may be performed to provide a substantially flat surface for subsequent processing steps. In some embodiments, the corresponding second conductive line 207 may be served as an etch stop layer during formation of the via opening.

In some embodiments, the sidewalls of the second through semiconductor via 217 may be slightly tapered such as between about 85 degree and about 88 degree. In some embodiments, the widths of the second through semiconductor via 217 may be between about 1 μm and about 22 μm or between about 5 μm and about 15 μm. In some embodiments, the depths of the second through semiconductor via 217 may be between about 20 μm and about 160 μm or between about 50 μm and about 130 μm.

Figure 8:
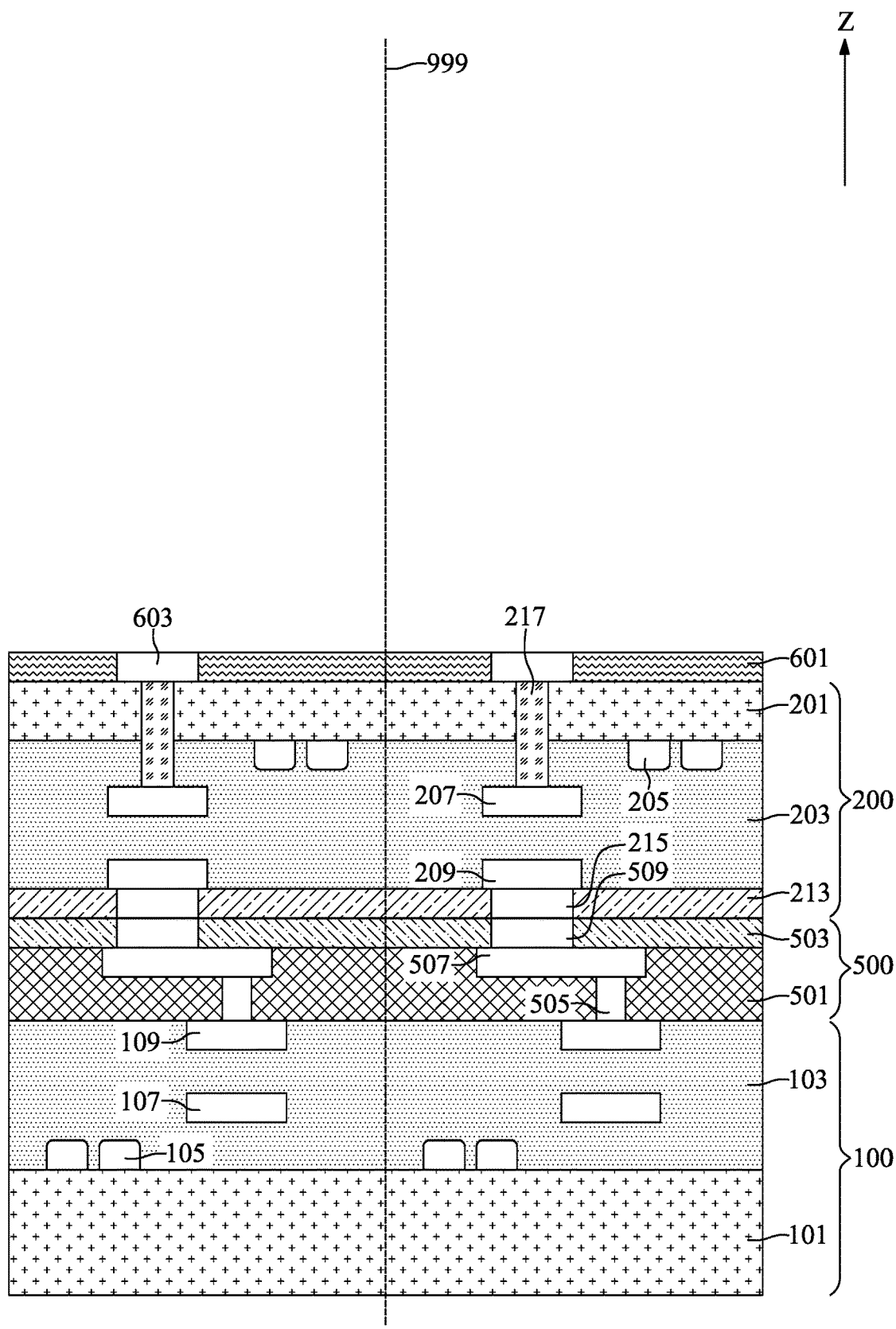

With reference to FIGS. 1 and 8, at step S21, a first interconnect layer 601 may be formed on the second semiconductor structure 200 and a plurality of first conductors 603 may be formed to electrically couple to the plurality of second through semiconductor vias 217.

With reference to FIG. 8, in some embodiments, the first interconnect layer 601 may be formed of, for example, a non-organic material selected from un-doped silicate glass, silicon nitride, silicon oxynitride, silicon oxide, silicon nitride oxide, silicon carbon nitride, and a combination thereof. In some embodiments, the first interconnect layer 601 may be formed of, for example, a polymer layer such as an epoxy, polyimide, benzocyclobutene, polybenzoxazole, benzocyclobutene, silicone, acrylates, nano-filled phenoresin, siloxane, a fluorinated polymer, polynorbornene, or the like. The first interconnect layer 601 may be formed by a deposition process such as chemical vapor deposition, plasma-enhanced chemical vapor deposition, evaporation, or spin-on coating.

For convenience of description, only first conductor 603 is described.

With reference to FIG. 8, the first conductor 603 may be formed along the first interconnect layer 601 and may be physically and electrically coupled to the second through semiconductor via 217. The first conductors 603 and the second through semiconductor via 217 may be topologically aligned. The first conductor 603 may be formed of, for example, tungsten, cobalt, zirconium, tantalum, titanium, aluminum, ruthenium, copper, metal carbides, metal nitrides, transition metal aluminides, or a combination thereof.

Figure 9:
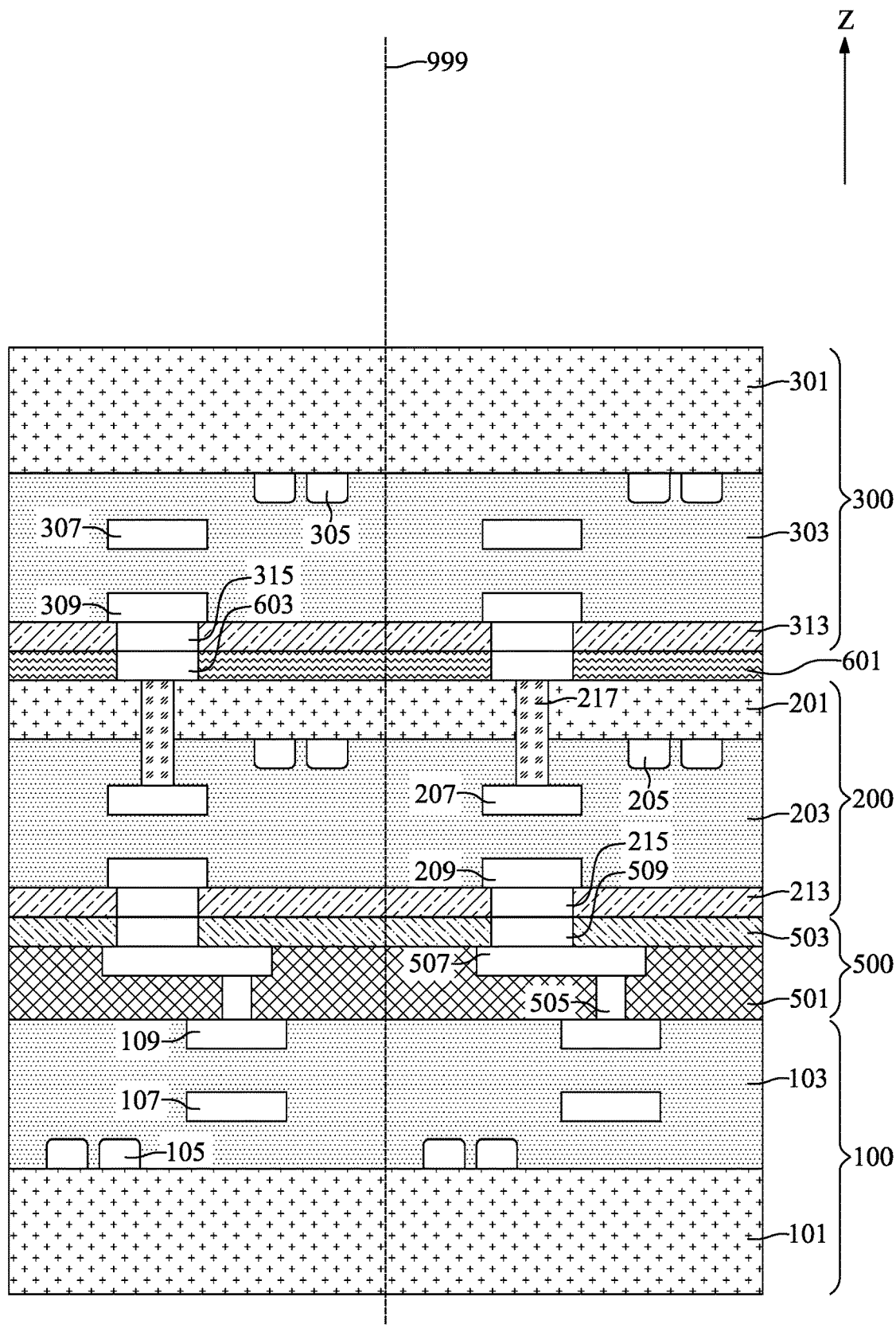
Figure 10:
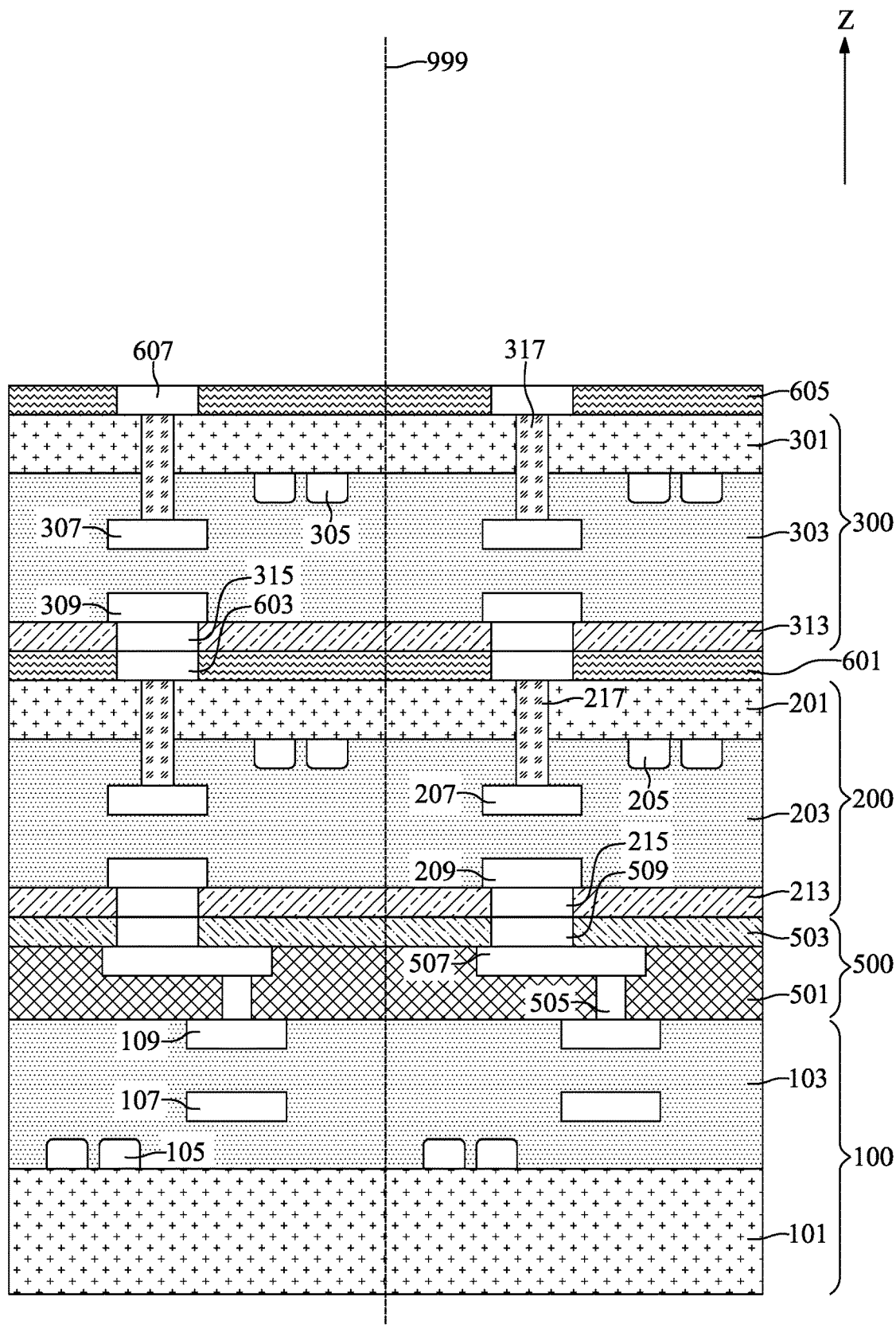

With reference to FIGS. 1, 9, and 10, at step S23, a third semiconductor structure 300 may be formed on the first interconnect layer 601, a plurality of third through semiconductor vias 317 may be formed to electrically couple to corresponding third conductive lines 307 in a third circuit layer 303 of the third semiconductor structure 300, a second interconnect layer 605 may be formed on the third semiconductor structure 300, and a plurality of second conductors 607 may be formed to electrically couple to the plurality of third through semiconductor vias 317.

With reference to FIG. 9, the third semiconductor structure 300 may be provided and may be subsequently flipped to bond onto the first interconnect layer 601. In some embodiments, the third semiconductor structure 300 may have a same structure as the second semiconductor structure 200. The third semiconductor structure 300 may include a third substrate 301, a third circuit layer 303, a third bonding layer 313, and a plurality of third bonding pads 315. The third substrate 301 may have a same structure as the second substrate 201 and may be formed of a same material as the second substrate 201. The third circuit layer 303 may have a same structure as the second circuit layer 203 and may include inter-layer dielectric layers and/or inter-metal dielectric layers containing a plurality of third device elements 305 and a plurality of third conductive features (e.g., third conductive lines 307, third conductive pads 309, and third conductive vias). The third circuit layer 303 and the second circuit layer 203 may have a same layout and the third semiconductor structure 300 and the second semiconductor structure 200 may provide a same functionality. The third bonding layer 313 and the plurality of third bonding pads 315 may have the same structures as the second bonding layer 213 and the plurality of second bonding pads 215, respectively.

The bonding process for the third semiconductor structure 300 and the first interconnect layer 601 may be similar to that illustrated in FIG. 5, and descriptions thereof are not repeated herein.

With reference to FIG. 10, a thinning process may be optionally performed to reduce the thickness of the third substrate 301. The thinning process may be performed with a procedure similar to that illustrated in FIG. 6, and descriptions thereof are not repeated herein. After the thinning process, the plurality of third through semiconductor vias 317 may be formed along the third substrate 301, extending to the third circuit layer 303, and physically and electrically coupled to a corresponding third conductive line 307 in the third circuit layer 303. The plurality of third through semiconductor vias 317 may be formed with a procedure similar to that illustrated in FIG. 7, and descriptions thereof are not repeated herein. After the formation of the third semiconductor structure 300, the second interconnect layer 605 and the plurality of second conductors 607 may be formed with a procedure similar to the first interconnect layer 601 and the plurality of first conductors 603 illustrated in FIG. 8, and descriptions thereof are not repeated herein.

Figure 11:
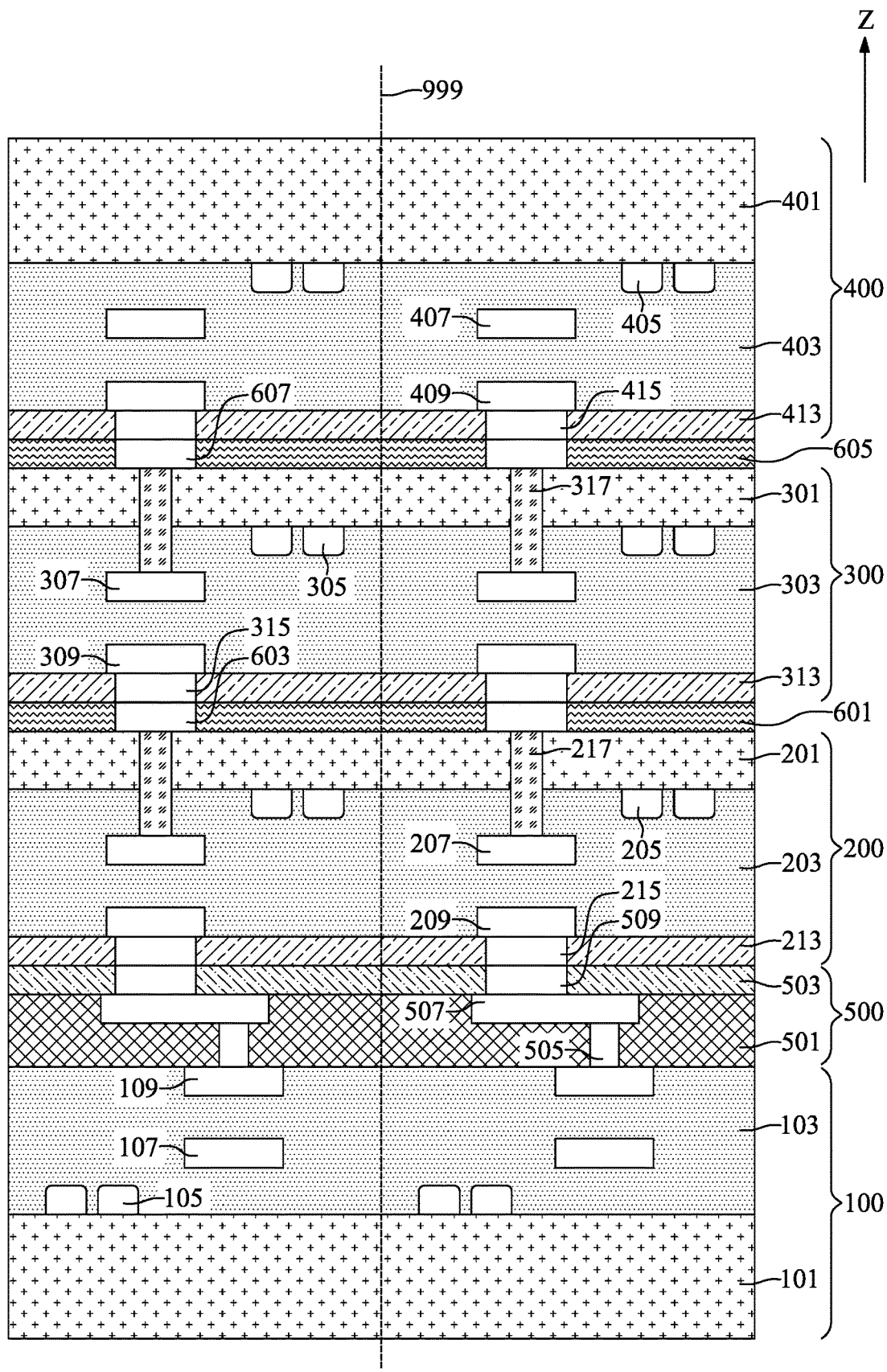

With reference to FIGS. 1 and 11, at step S25, a fourth semiconductor structure 400 may be bonded onto the second interconnect layer 605 to configure an intermediate wafer stack.

With reference to FIG. 11, the fourth semiconductor structure 400 may be provided and may be subsequently flipped to bond onto the second interconnect layer 605. In some embodiments, the fourth semiconductor structure 400 may have a same structure as the third semiconductor structure 300. The fourth semiconductor structure 400 may include a fourth substrate 401, a fourth circuit layer 403, a fourth bonding layer 413, and a plurality of fourth bonding pads 415 and may have same structure as the third substrate 301, the third circuit layer 303, the third bonding layer 313, and the plurality of third bonding pads 315, respectively. The fourth circuit layer 403 may include inter-layer dielectric layers and/or inter-metal dielectric layers containing a plurality of fourth device elements 405 and a plurality of fourth conductive features (e.g., fourth conductive lines 407, fourth conductive pads 409, and fourth conductive vias). The fourth circuit layer 403 and the third circuit layer 303 may have a same layout and the fourth semiconductor structure 400 and the third semiconductor structure 300 may provide a same functionality.

The bonding process for the fourth semiconductor structure 400 and the second interconnect layer 605 may be similar to that illustrated in FIG. 5, and descriptions thereof are not repeated herein.

With reference to FIG. 11, the first semiconductor structure 100, the first redistribution structure 500, the second semiconductor structure 200, the third semiconductor structure 300, the fourth semiconductor structure 400, the plurality of second through semiconductor vias 217, the plurality of third through semiconductor vias 317, the first interconnect layer 601, the plurality of first conductors 603, the second interconnect layer 605, and the plurality of second conductors 607 together configure the intermediate wafer stack.

Figure 12:
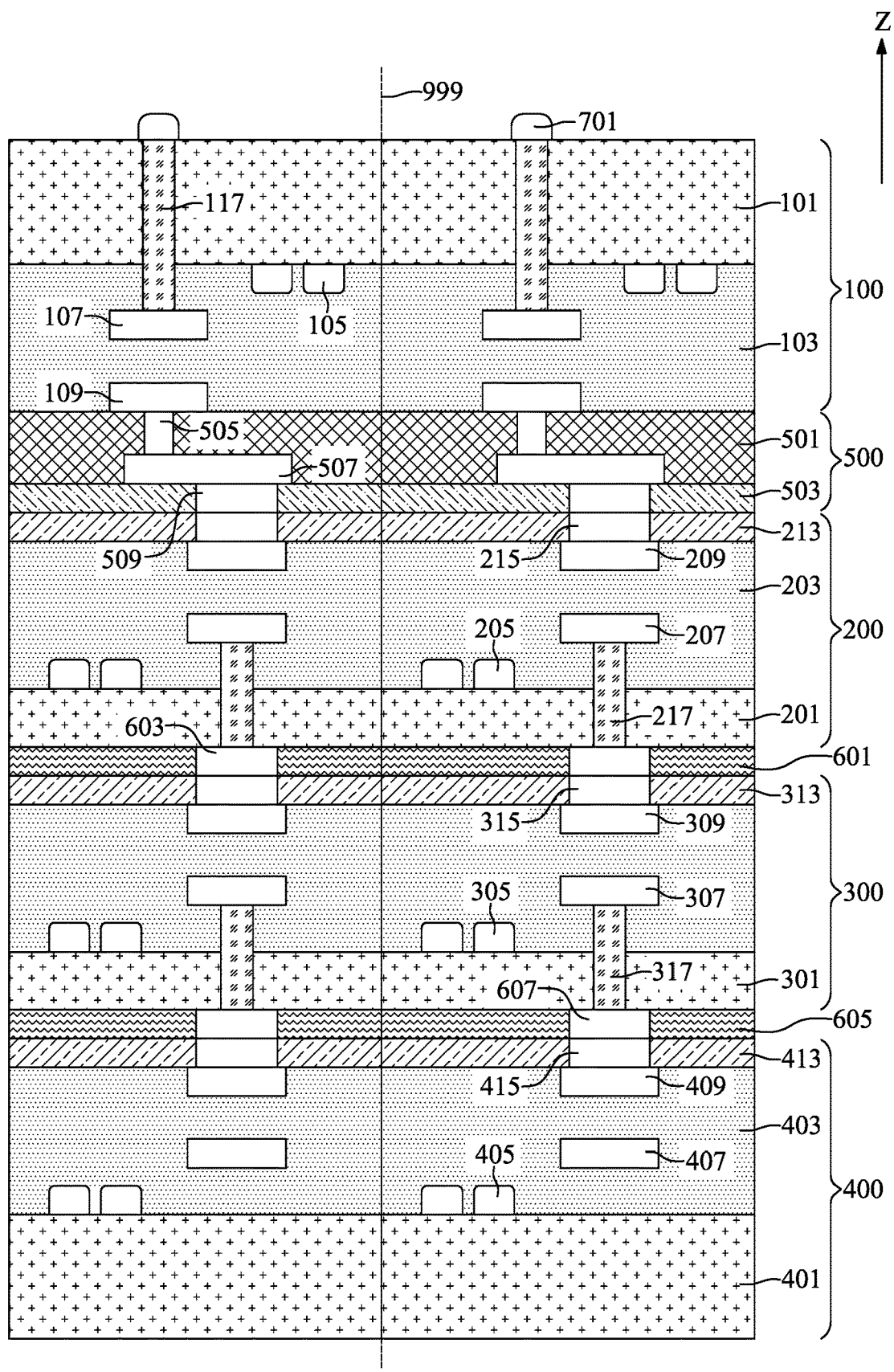
Figure 13:
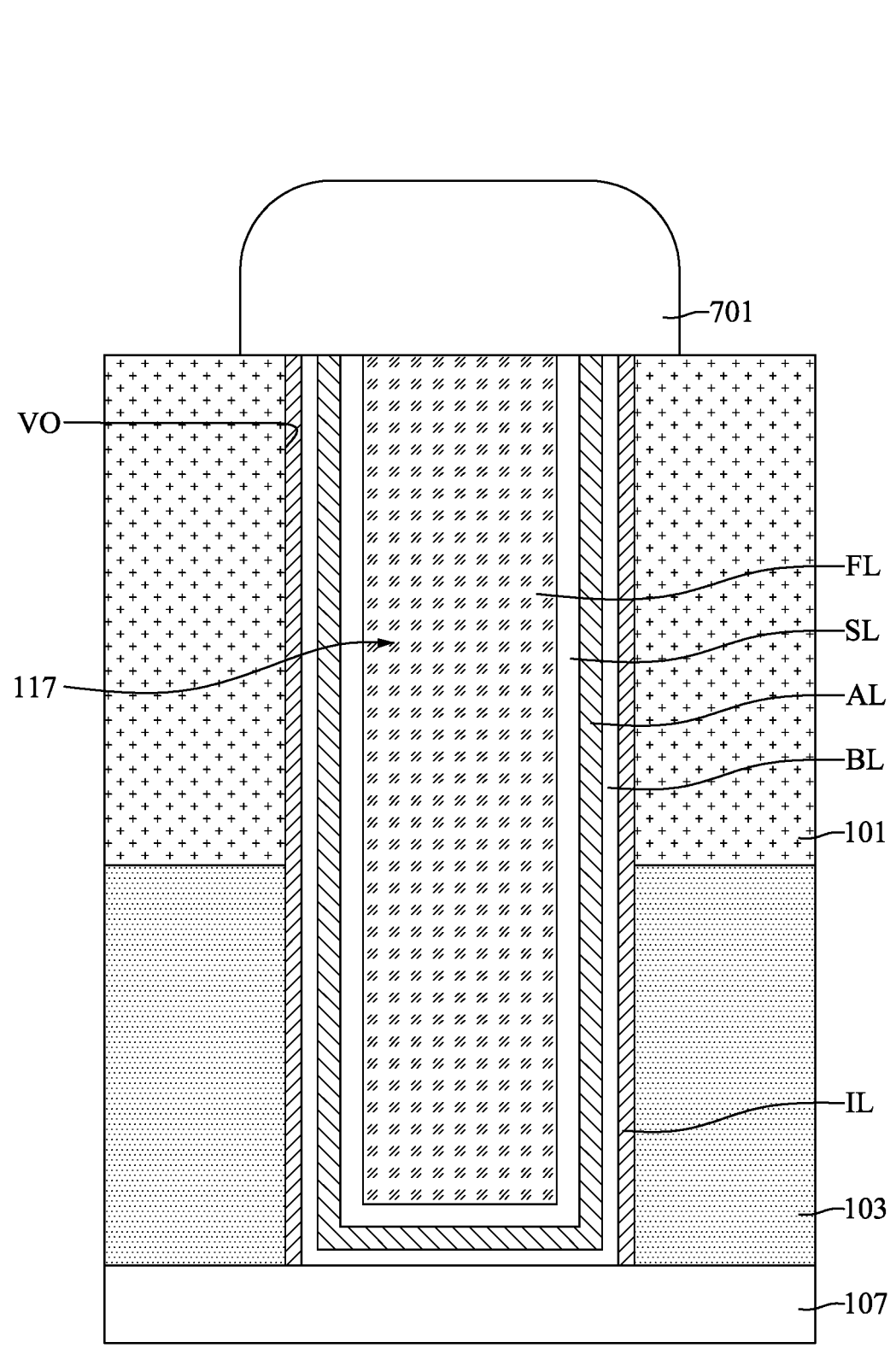
FIG. 13 illustrates, in a schematic close-up cross-sectional view diagram, an intermediate semiconductor device in accordance with one embodiment of the present disclosure.
Figure 14:
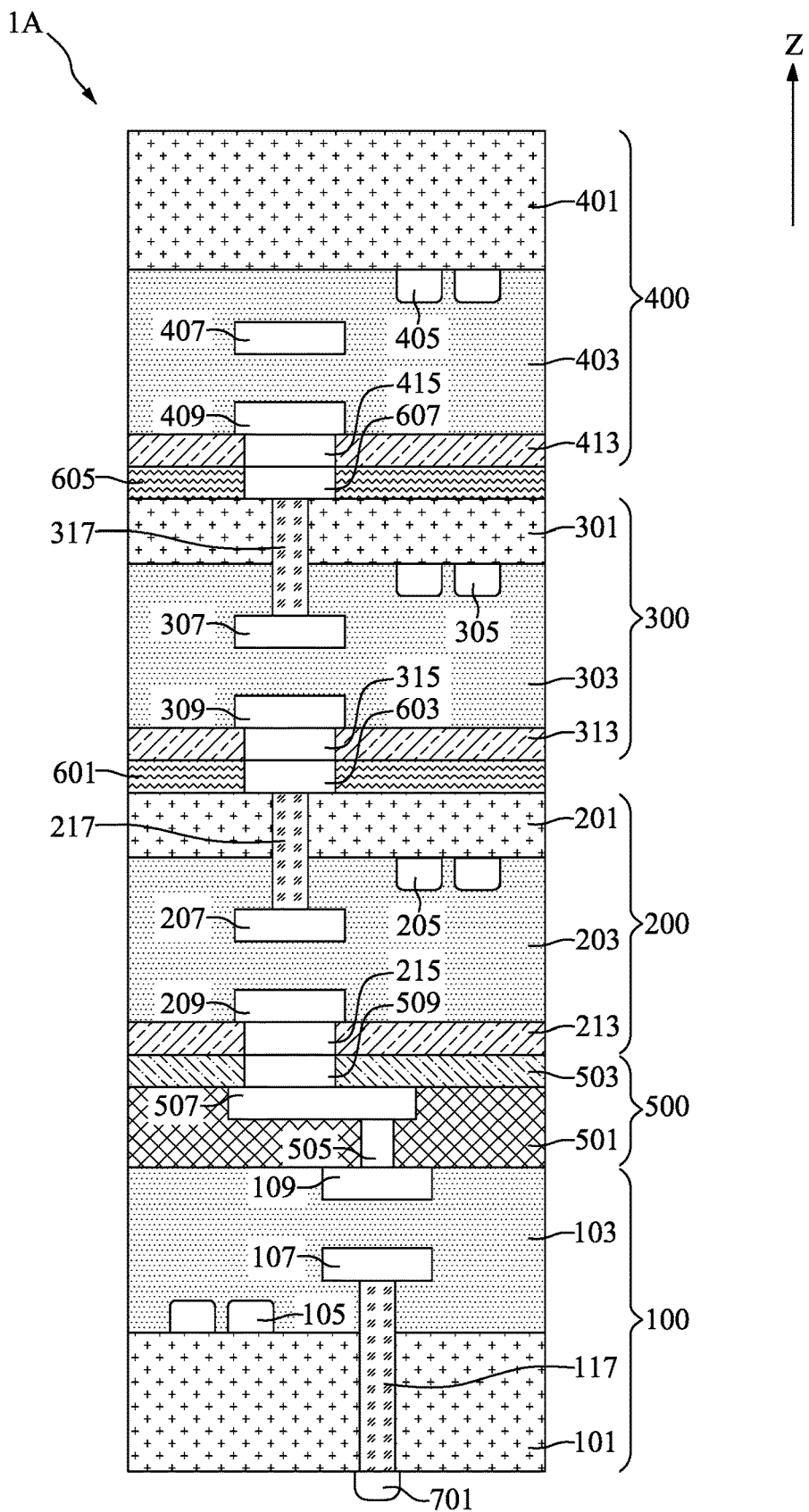
FIG. 14 illustrate, in a schematic cross-sectional view diagram, part of the flow for fabricating the semiconductor device in accordance with one embodiment of the present disclosure.

With reference to FIGS. 1, 12, and 13, at step S27, the intermediate wafer stack may be flipped, a plurality of first through semiconductor vias 117 may be formed to electrically couple to the first conductive lines 107 in the first circuit layer 103, and a plurality of connectors 701 may be formed on the plurality of first through semiconductor vias 117.

For convenience of description, only one first through semiconductor via 117 and one connector 701 are described.

With reference to FIG. 12, the intermediate wafer stack illustrated in FIG. 11 may be flipped to make the back surface of the first semiconductor structure 100 face upward. A thinning process with a procedure similar to that illustrated in FIG. 6 may be optionally performed to reduce the thickness of the first substrate 101. The first through semiconductor via 117 may be formed along the first substrate 101, extending to the first circuit layer 103, and physically and electrically coupled to a corresponding first conductive line 107 in the first circuit layer 103.

With reference to FIG. 13, the first through semiconductor via 117 may be formed by forming a via opening VO at least partially expose the corresponding first conductive line 107 and filling the via opening. Specifically, the first through semiconductor via 117 may include a filler layer FL, a seed layer SL, an adhesive layer AL, a barrier layer BL, and two isolation layers IL.

With reference to FIG. 13, the two isolation layers IL may be conformally formed on two sidewalls of the via opening VO. In some embodiments, the two isolation layers IL may be formed of, for example, silicon oxide, silicon nitride, silicon oxynitride, or tetra-ethyl ortho-silicate. The two isolation layers IL may have a thickness between about 50 nm and about 200 nm. Alternatively, in some embodiments, the two isolation layers IL may be formed of, for example, parylene, epoxy, or poly(p-xylene). The two isolation layers IL may have a thickness between about 1 µm and about 5 µm. The two isolation layers IL may ensure the filler layer FL is electrically isolated in the first substrate 101 and the first circuit layer 103.

With reference to FIG. 13, the barrier layer BL may be conformally formed on the isolation layer IL and on the bottom surface of the via opening VO. The barrier layer BL may have a U-shaped cross-sectional profile. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the isolation layer IL. The barrier layer BL may be formed by deposition process such as physical vapor deposition, atomic layer deposition, chemical vapor deposition, or sputtering.

With reference to FIG. 13, the adhesive layer AL may be conformally formed on the barrier layer BL and may have a U-shaped cross-sectional profile. The adhesive layer AL may be formed of, for example, titanium, tantalum, titanium tungsten, or manganese nitride. The adhesive layer AL may improve an adhesion between the seed layer SL and the barrier layer BL. The adhesive layer AL may have a thickness between about 5 nm and about 50 nm. The adhesive layer AL may be formed by deposition process such as physical vapor deposition, atomic layer deposition, chemical vapor deposition, or sputtering.

With reference to FIG. 13, the seed layer SL may be conformally formed on the adhesive layer AL and may have a U-shaped cross-sectional profile. The seed layer SL may have a thickness between about 10 nm and about 40 nm. The seed layer SL may be formed of, for example, copper or ruthenium. The seed layer SL may be formed by deposition process such as physical vapor deposition, atomic layer deposition, chemical vapor deposition, or sputtering. The seed layer SL may reduce resistivity of the via opening VO during the formation of the filler layer FL by an electroplating process.

With reference to FIG. 13, the filler layer FL may be formed on the seed layer SL and completely fill the via opening VO. The filler layer FL may be, for example, copper. The filler layer FL may be formed by an electroplating process.

With reference to FIGS. 1 and 14, at step S29, the intermediate wafer stack may be cut along the scribe line 999 to form the semiconductor device 1A.

With reference to FIG. 14, the intermediate wafer stack may be divided into multiple dies by cutting along the scribe line 999. Each die may be referred to as the semiconductor device 1A.

Figure 15:
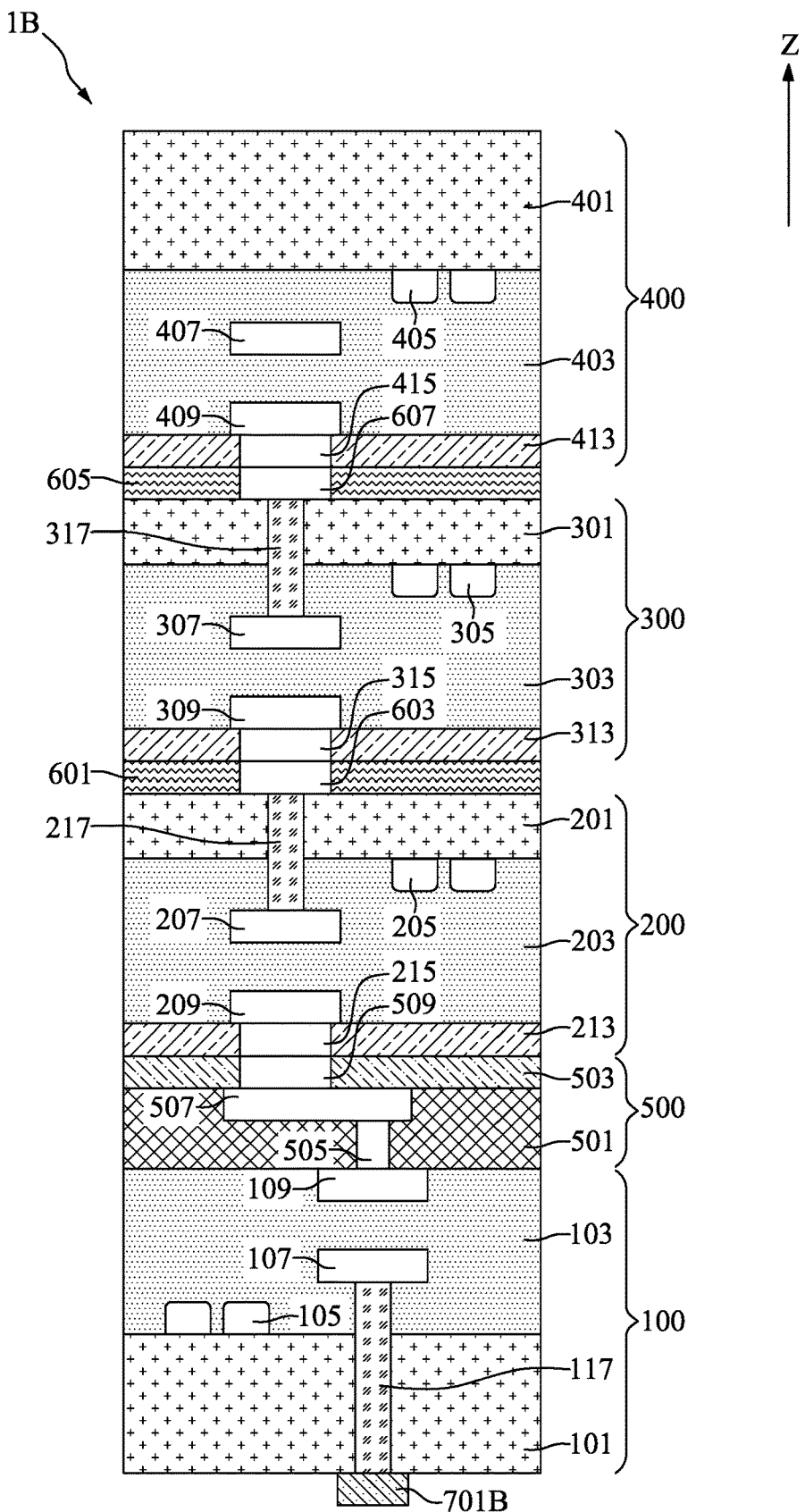
FIGS. 15 and 16 illustrate, in schematic cross-sectional view diagrams, semiconductor devices in accordance with some embodiments of the present disclosure.
Figure 16:
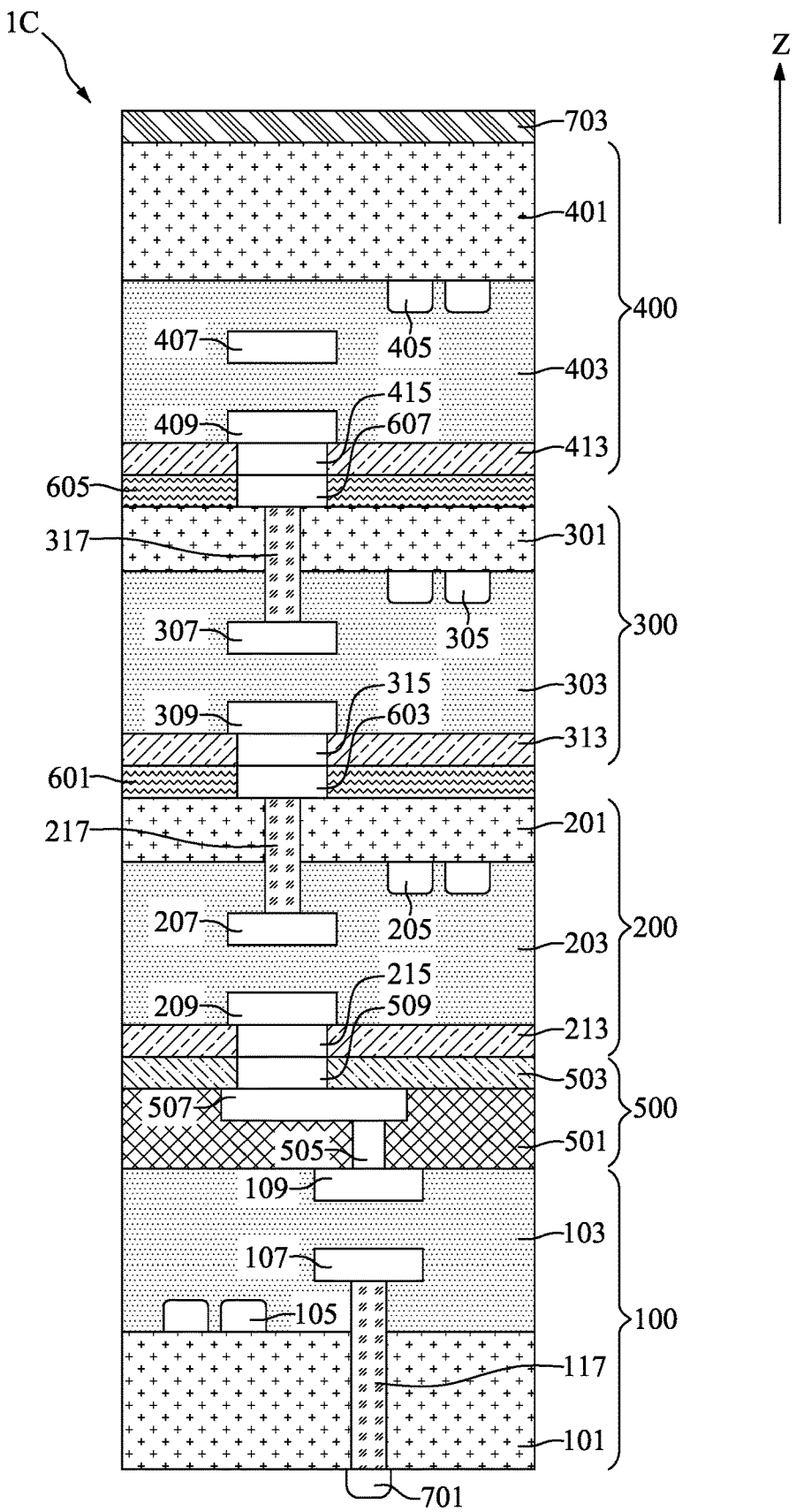

FIGS. 15 and 16 illustrate, in schematic cross-sectional view diagrams, semiconductor devices 1B and 1C in accordance with some embodiments of the present disclosure.

With reference to FIG. 15, the semiconductor device 1B may have a structure similar to that illustrated in FIG. 14. The same or similar elements in FIG. 15 as in FIG. 14 have been marked with similar reference numbers and duplicative descriptions have been omitted.

In the semiconductor device 1B, the connector 701B disposed on the first through semiconductor via 117 may be a pillar bump formed of, for example, copper. The pillar bump may be formed directly on the first through semiconductor via 117, without requiring contact pads, under bump metallurgy, or the like, thus further reducing cost and process complexity of fabricating the semiconductor device 1B, which may allow for increased density of pillar bumps. For example, in some embodiments, a critical dimension of a pillar bump (e.g., pitch) may be less than about 5 µm, and the pillar bump may have a height less than about 10 µm. The pillar bump may be formed using any suitable method, such as, depositing a seed layer, optionally forming a under bump metallurgy, using a mask to define a shape of the pillar bump, electro-chemically plating the pillar bump in the mask, and subsequently removing the mask and any undesired portions of the seed layer. The pillar bump may be used to electrically connect the semiconductor device 1B to other package components such as, fan-out redistribution layer, package substrates, interposers, printed circuit boards, and the like.

With reference to FIG. 16, the semiconductor device 1C may have a structure similar to that illustrated in FIG. 14. The same or similar elements in FIG. 16 as in FIG. 14 have been marked with similar reference numbers and duplicative descriptions have been omitted.

The semiconductor device 1C may include a thermal dissipation layer 703 on the fourth substrate 401. In some embodiments, the thermal dissipation layer 703 may be formed of a carbon material that is imbued with a flexible material such as a polymer matrix. For example, the thermal dissipation layer 703 may include generally vertically oriented graphite and carbon nanotubes, which are imbued with a fluoropolymer rubber matrix. The aspect ratio of the carbon nanotubes may be between about 1:1 and about 1:100. For another example, the thermal dissipation layer 703 may include graphitic carbon. For yet another example, the thermal dissipation layer 703 may include pyrolytic graphite sheet. In some embodiments, a thermal resistance of the thermal dissipation layer 703 may be less than 0.2° C. cm^2/Watt at a thickness between about 250 µm and about 450 µm. The thermal dissipation layer 703 may provide additional thermal dissipation capability to the semiconductor device 1C.

Figure 17:
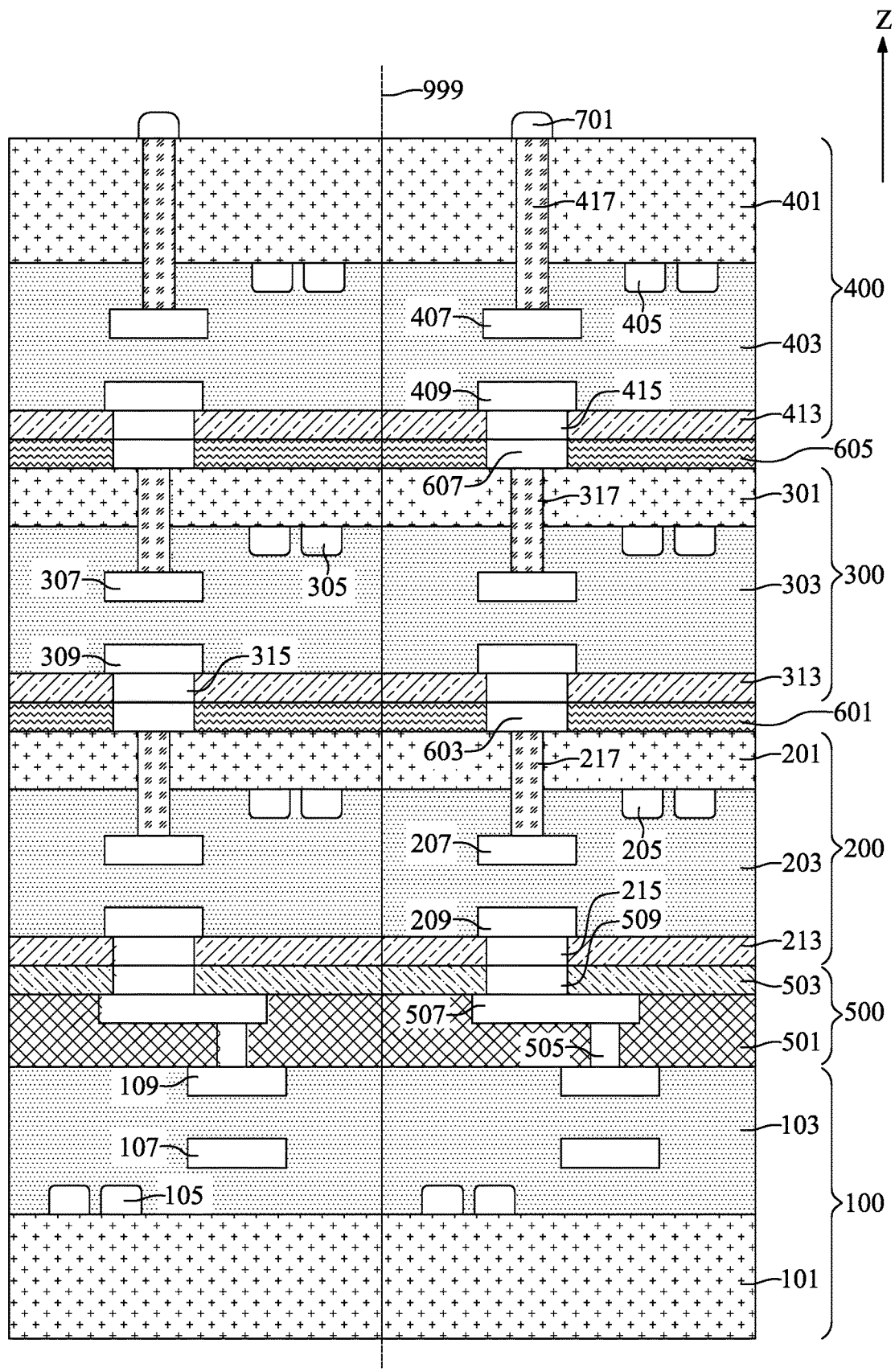
FIGS. 17 and 18 illustrate, in schematic cross-sectional view diagrams, a flow for fabricating a semiconductor device in accordance with another embodiment of the present disclosure.
Figure 18:
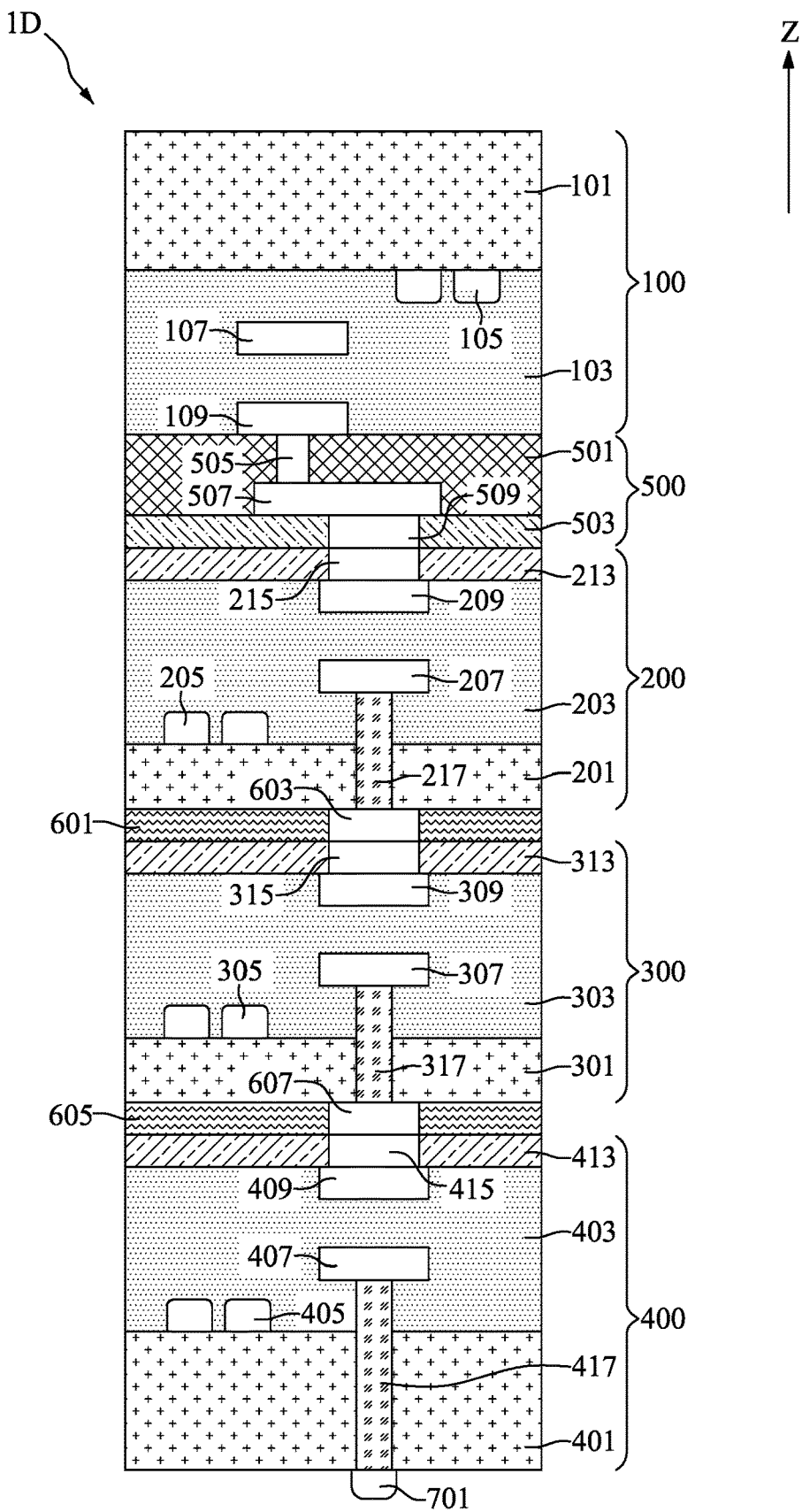

FIGS. 17 and 18 illustrate, in schematic cross-sectional view diagrams, a flow for fabricating a semiconductor device 1D in accordance with another embodiment of the present disclosure.

With reference to FIG. 17, an intermediate wafer stack may be fabricated with a procedure similar to that illustrated in FIGS. 2 to 11. For convenience of description, only one fourth through semiconductor vias 417 is described. The fourth through semiconductor vias 417 may be formed along the fourth substrate 401, extending to the fourth circuit layer 403, and physically and electrically coupled to a corresponding fourth conductive line 407. The formation of the fourth through semiconductor vias 417 may be performed with a procedure similar to that illustrated in FIG. 12, and descriptions thereof are not repeated herein. The plurality of connectors 701 may be respectively correspondingly formed on the plurality of fourth through semiconductor vias 417 with a procedure similar to that illustrated in FIG. 12, and descriptions thereof are not repeated herein.

With reference to FIG. 18, the intermediate wafer stack in FIG. 17 may be cut along the scribe line 999 and may be dived into multiple dies. Each die may be referred to as the semiconductor device 1D.

FIGS. 19 to 23 illustrate, in schematic cross-sectional view diagrams, a flow for fabricating a semiconductor device 1E in accordance with another embodiment of the present disclosure.

Figure 19:
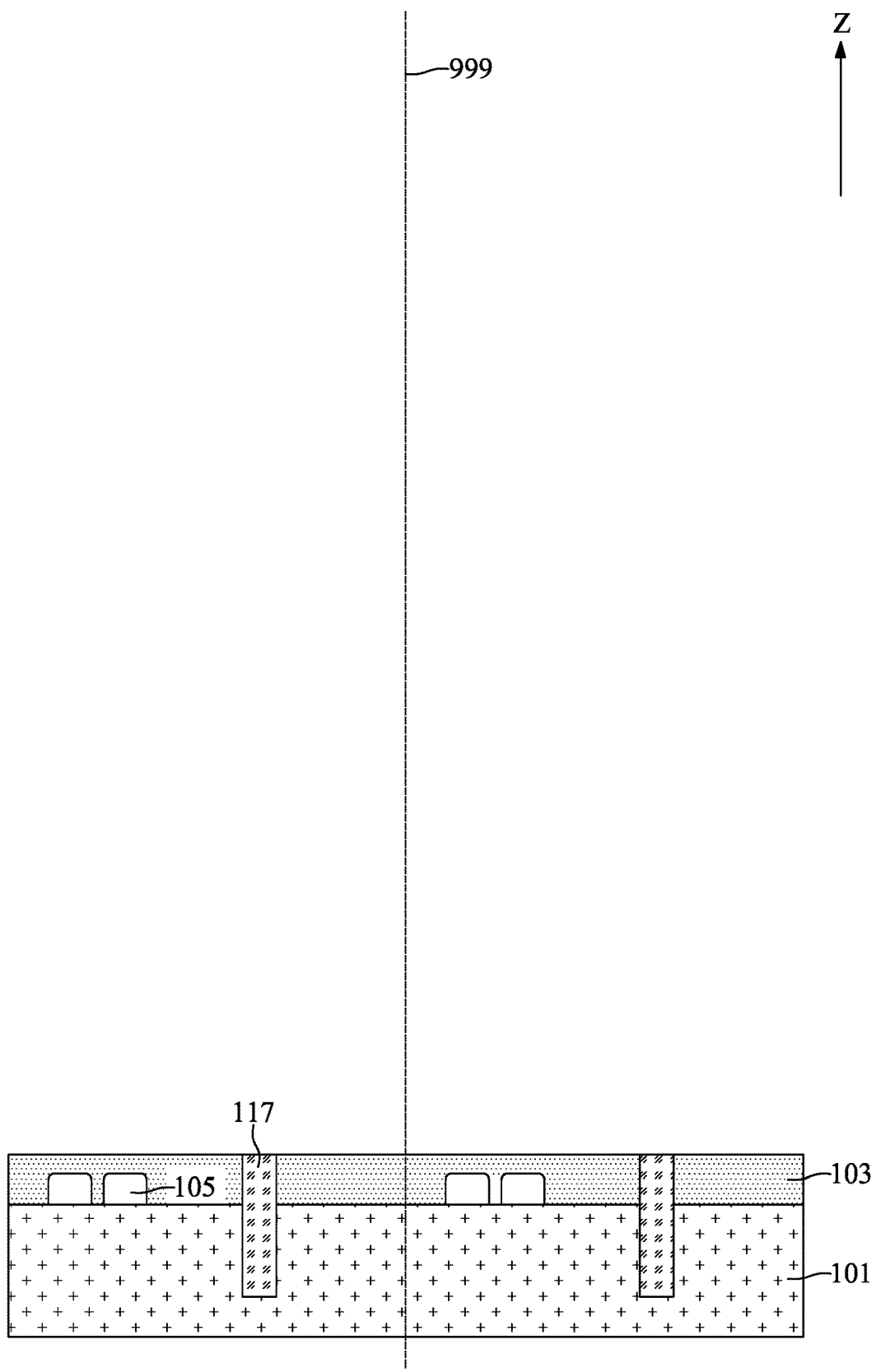
FIGS. 19 to 23 illustrate, in schematic cross-sectional view diagrams, a flow for fabricating a semiconductor device in accordance with another embodiment of the present disclosure.

With reference to FIG. 19, a plurality of first device elements 105 may be formed on a first substrate 101. The first substrate 101 and the plurality of first device elements 105 are the same as illustrated in FIG. 2, and descriptions thereof are not repeated herein. An insulating layer may be formed on the first substrate 101 to cover the plurality of first device elements 105. A planarization process, such as chemical mechanical polishing, may be performed to provide a substantially flat surface for subsequent processing steps. The insulating layer may be designated as part of a first circuit layer 103. Subsequently, a plurality of first through semiconductor vias 117 may be formed along the insulating layer and extending to the first substrate 101. The formation of the plurality of first through semiconductor vias 117 may be performed with a procedure similar to that illustrated in FIG. 12, and descriptions thereof are not repeated herein.

For convenience of description, only one first through semiconductor vias 117 is described.

Figure 20:
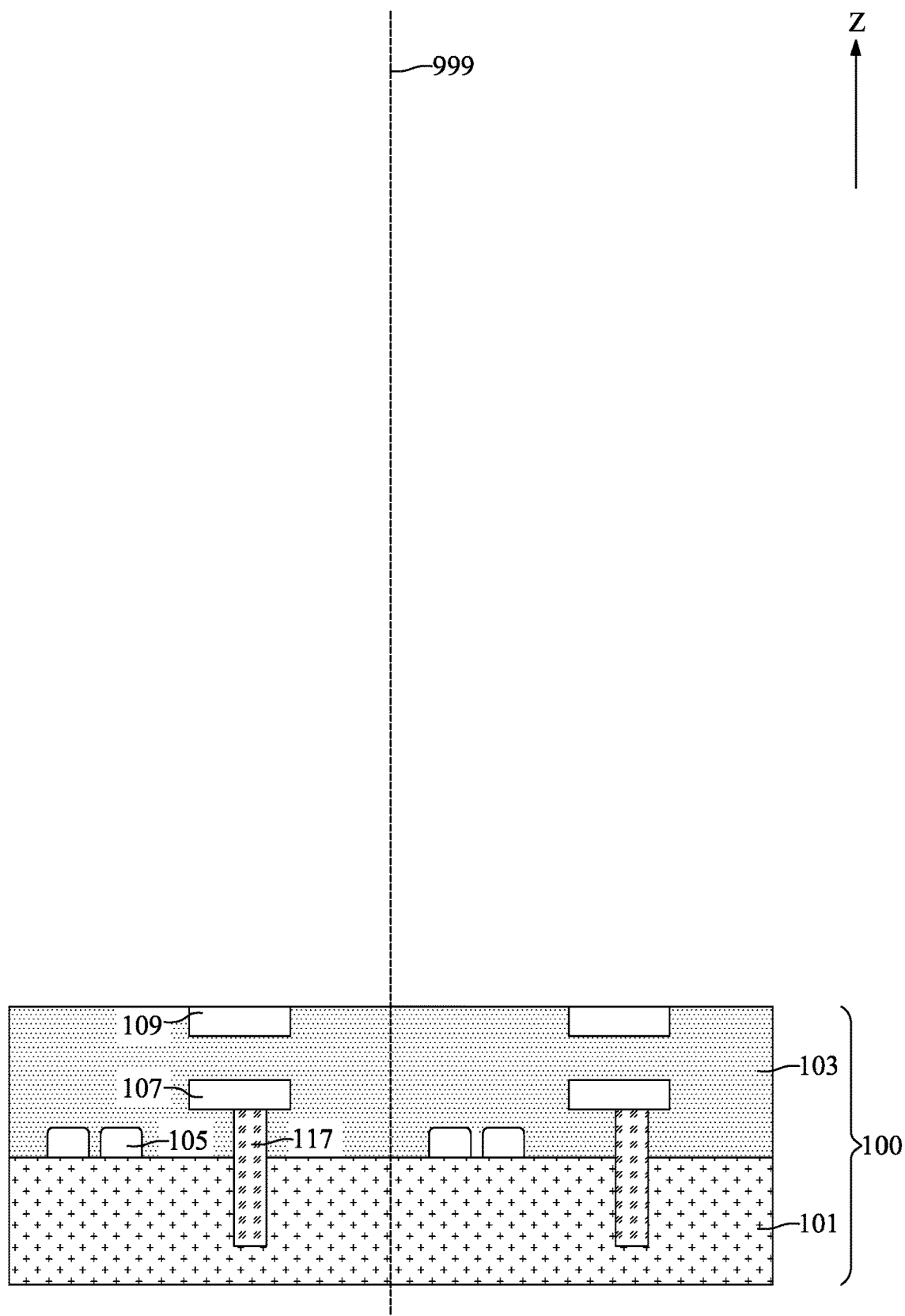

With reference to FIG. 20, the inter-layer dielectric layers and/or inter-metal dielectric layers containing a plurality of first conductive features such as first conductive lines 107, first conductive pads 109, and first conductive vias may be formed over the intermediate semiconductor device illustrated in FIG. 19. The dielectric layers and the plurality of first conductive features together configure the first circuit layer 103. The first through semiconductor via 117 may be electrically coupled to a corresponding first conductive line 107 in the first circuit layer 103. The first circuit layer 103 and the first substrate 101 together configure a first semiconductor structure 100.

Figure 21:
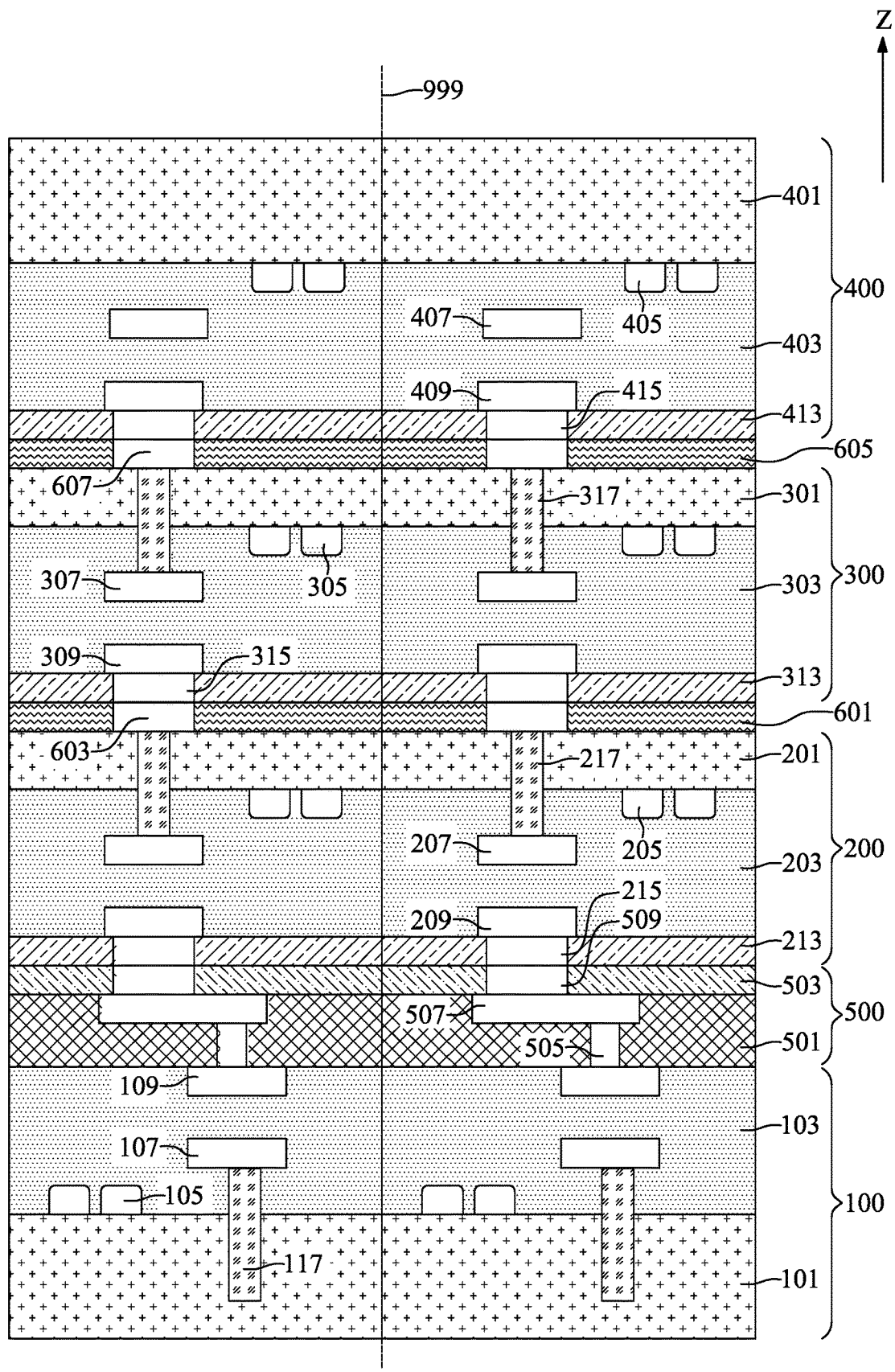

With reference to FIG. 21, the first redistribution structure 500, the second semiconductor structure 200, the plurality of second through semiconductor vias 217, the first interconnect layer 601, the plurality of first conductors 603, the third semiconductor structure 300, the plurality of third through semiconductor vias 317, the second interconnect layer 605, the plurality of second conductors 607, and the fourth semiconductor structure 400 may be sequentially formed to form an intermediate wafer stack with a procedure similar to that illustrated in FIGS. 3 to 11, and descriptions thereof are not repeated herein.

Figure 22:
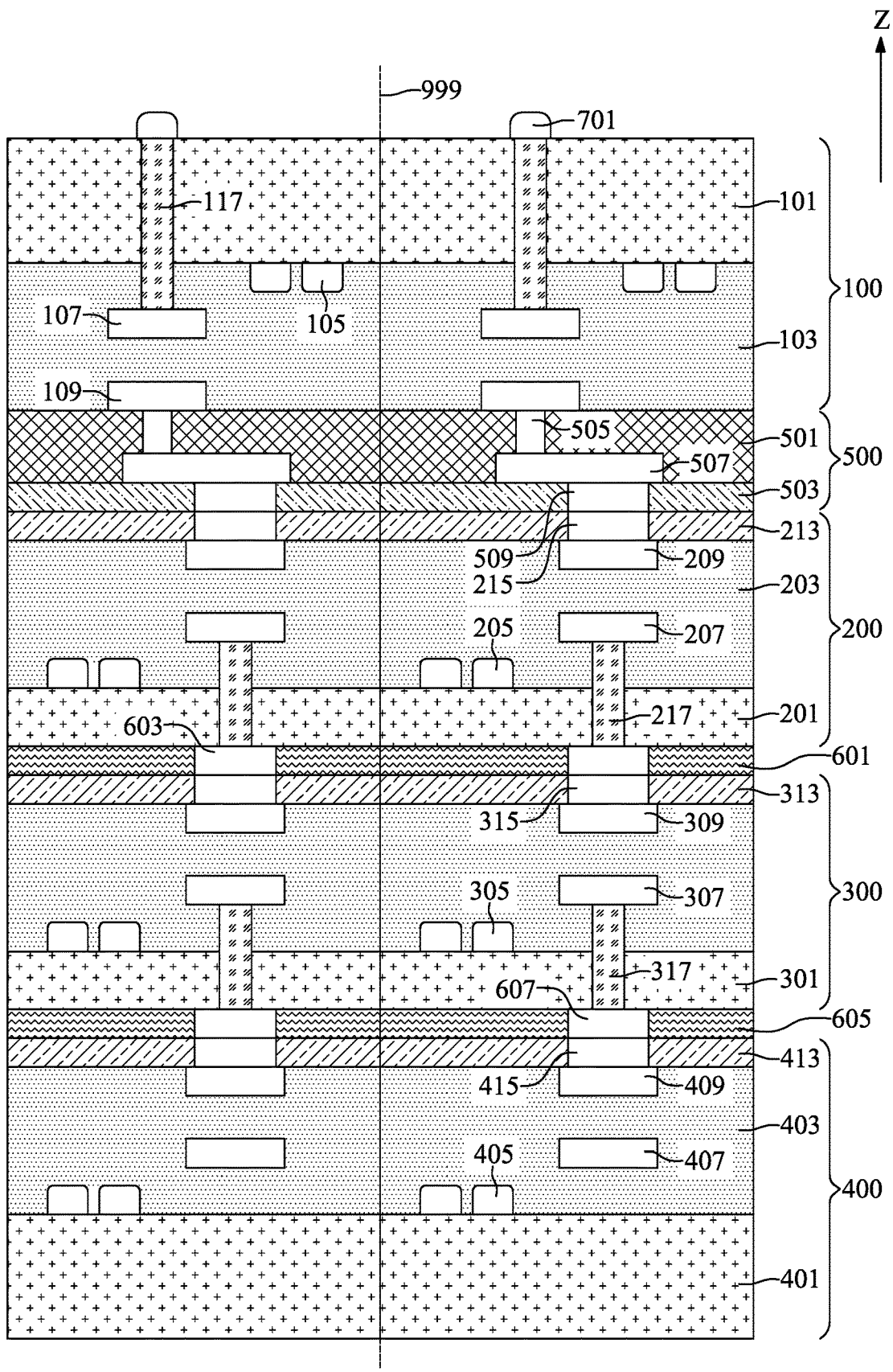

With reference to FIG. 22, the intermediate wafer stack illustrated in FIG. 22 may be flipped. A thinning process may be performed to reduce the thickness of the first substrate 101 and to expose the first through semiconductor via 117. The thinning process may be performed with a procedure similar to that illustrated in FIG. 6, and descriptions thereof are not repeated herein. The connector 701 may be formed on the first through semiconductor via 117 with a procedure similar to that illustrated in FIG. 12, and descriptions thereof are not repeated herein.

Figure 23:
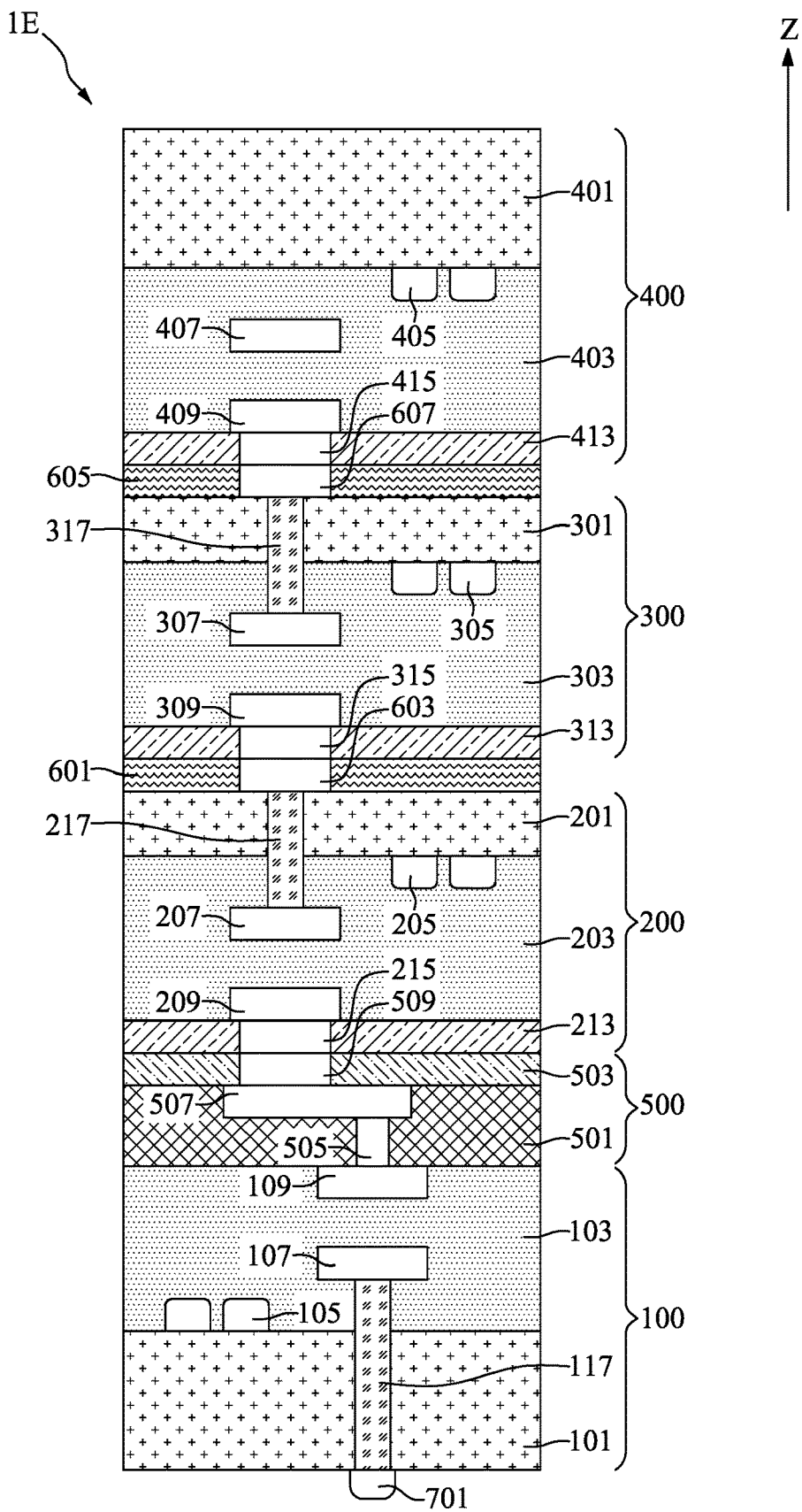

With reference to FIG. 23, the intermediate wafer stack in FIG. 22 may be cut along the scribe line 999 and may be divided into multiple dies. Each die may be referred to as the semiconductor device 1E.

One aspect of the present disclosure provides a semiconductor device including a first semiconductor structure including a first substrate, and a first circuit layer positioned on the first substrate, a first redistribution structure positioned on the first circuit layer, and a second semiconductor structure including a second circuit layer positioned on the first redistribution structure, and a second substrate positioned on the second circuit layer. A layout of the first circuit layer and a layout of the second circuit layer are substantially the same and the first redistribution structure is electrically coupled to the first semiconductor structure and the second semiconductor structure.

Another aspect of the present disclosure provides a semiconductor device including a fourth semiconductor structure including a fourth substrate, and a fourth circuit layer positioned on the fourth substrate, a third semiconductor structure including a third circuit layer positioned on the fourth circuit layer, a second semiconductor structure including a second circuit layer positioned on the third semiconductor structure, a first semiconductor structure including a first circuit layer positioned on the second semiconductor structure, a first redistribution structure including a first redistribution pad topologically aligned with and electrically coupled to a corresponding second conductive pad in the second circuit layer, a first redistribution line physically and electrically coupled to the first redistribution pad, and a first redistribution via physically and electrically coupled to the first redistribution line, and topologically aligned with and electrically coupled to a corresponding first conductive pad in the first circuit layer, and a fourth through semiconductor via positioned along the fourth substrate, extending to the fourth circuit layer, and topologically aligned with and electrically coupled to a corresponding fourth conductive line in the fourth circuit layer. A layout of the fourth circuit layer, a layout of the third circuit layer, a layout of the second circuit layer, and a layout of the first circuit layer are substantially the same.

Another aspect of the present disclosure provides a method for fabricating a semiconductor device including providing a first semiconductor structure including a first substrate, and a first circuit layer on the first substrate, forming a first redistribution structure on the first semiconductor structure and electrically coupled to the first semiconductor structure, bonding a second circuit layer on the first redistribution structure through a wafer-to-wafer hybrid bonding process, and forming a first through semiconductor via along the first substrate, extending to the first circuit layer, and electrically coupled to a corresponding first conductive line in the first circuit layer. The first redistribution structure is electrically coupled to a corresponding second conductive pad in the second circuit layer. A layout of the first circuit layer and a layout of the second circuit layer are substantially the same.

Another aspect of the present disclosure provides a method for fabricating a semiconductor device including providing a first substrate, forming a plurality of first device elements on the first substrate, forming a first through semiconductor via extending to the first substrate, forming a first circuit layer to cover the plurality of first device elements, forming a first redistribution structure on the first circuit layer and electrically coupled to a corresponding first conductive pad in the first circuit layer, and bonding a second circuit layer on the first redistribution structure through a wafer-to-wafer hybrid bonding process. The first through semiconductor via is electrically coupled to a corresponding first conductive line in the first circuit layer. The first redistribution structure is electrically coupled to a corresponding second conductive pad in the second circuit layer. A layout of the first circuit layer and a layout of the second circuit layer are substantially the same.

Due to the design of the semiconductor device of the present disclosure, the first redistribution structure 500 may be electrically coupled to the first semiconductor structure 100 and the second semiconductor structure 200 having the same layout. Therefore, the cost and process complexity for fabricating the semiconductor device 1A may be reduced.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a first semiconductor structure comprising:
        a first substrate; and
        a first circuit layer positioned on the first substrate;
    a first redistribution structure positioned on the first circuit layer;
    a second semiconductor structure comprising:
        a second circuit layer positioned on the first redistribution structure; and
        a second substrate positioned on the second circuit layer;
    a third semiconductor structure comprising a third circuit layer positioned on the second substrate;
    a fourth semiconductor structure comprising a fourth circuit layer positioned on the third semiconductor structure; and
    a first through semiconductor via positioned along the first substrate, extending to the first circuit layer, and topologically aligned with and electrically coupled to a corresponding first conductive line in the first circuit layer; wherein the first through semiconductor via comprises:
        a filler layer positioned along the first substrate and extending to the first circuit layer; and
        two isolation layers positioned on two sides of the filler layer, wherein the two isolation layers comprise silicon oxide, silicon nitride, silicon oxynitride, tetraethyl ortho-silicate, parylene, epoxy, or poly(p-xylene);
    wherein a layout of the first circuit layer and a layout of the second circuit layer are substantially the same and the first redistribution structure is electrically coupled to the first semiconductor structure and the second semiconductor structure;
    wherein the layout of the second circuit layer, a layout of the third circuit layer, and a layout of the fourth circuit layer are substantially the same;
    wherein the first through semiconductor via comprises a seed layer positioned between the two isolation layers and the filler layer and between the filler layer and the corresponding first conductive line in the first circuit layer;
    wherein the first through semiconductor via comprises an adhesive layer positioned between the seed layer and the two isolation layer and between the seed layer and the corresponding first conductive line in the first circuit layer, wherein the adhesive layer comprises titanium, tantalum, titanium tungsten, or manganese nitride;
    wherein the first through semiconductor via comprises a barrier layer positioned between the adhesive layer and the two isolation layers and between the adhesive layer and the corresponding first conductive line in the first circuit layer, wherein the barrier layer comprises tantalum, tantalum nitride, titanium, titanium nitride, rhenium, nickel boride, or tantalum nitride/tantalum bilayer.

2. The semiconductor device of claim 1, wherein the first redistribution structure comprises:
    a first redistribution via topologically aligned with and electrically coupled to a corresponding first conductive pad in the first circuit layer;
    a first redistribution line physically and electrically coupled to the first redistribution via; and
    a first redistribution pad physically and electrically coupled to the first redistribution line and topologically aligned with and electrically coupled to a corresponding second conductive pad in the second circuit layer.

3. The semiconductor device of claim 2, wherein the second semiconductor structure comprises:
    a second bonding layer positioned between the second circuit layer and the first redistribution structure; and
    a second bonding pad positioned along the second bonding layer, and topologically aligned with and electrically coupled to the corresponding second conductive pad in the second circuit layer and the first redistribution pad.

4. The semiconductor device of claim 3, further comprising:
- a first interconnect layer positioned between the second semiconductor structure and the third semiconductor structure; and
- a first conductor positioned along the first interconnect layer, and electrically coupled to a corresponding third conductive pad in the third circuit layer and a corresponding second conductive line in the second circuit layer.

5. The semiconductor device of claim 4, wherein the third semiconductor structure comprises:
- a third bonding layer positioned between the first interconnect layer and the third circuit layer; and
- a third bonding pad positioned along the third bonding layer, and topologically aligned with and electrically coupled to the corresponding third conductive pad in the third circuit layer and the first conductor.

6. The semiconductor device of claim 5, further comprising a second through semiconductor via physically and electrically coupled to the first conductor and the corresponding second conductive line in the second circuit layer.

7. The semiconductor device of claim 1, further comprising a connector physically and electrically coupled to the first through semiconductor via, wherein the connector is a solder, a bump, or the like.

8. The semiconductor device of claim 7, further comprising a thermal dissipation layer positioned on the fourth semiconductor structure, wherein the thermal dissipation layer comprises vertically oriented graphite and carbon nanotubes.

* * * * *